United States Patent
Yoshikawa et al.

(10) Patent No.: US 10,011,720 B2
(45) Date of Patent: Jul. 3, 2018

(54) SILICONE-BASED ENCAPSULATING MATERIAL COMPOSITION AND SEMICONDUCTOR LIGHT-EMITTING DEVICE

(71) Applicant: Sumitomo Chemical Company, Limited, Chuo-ku, Tokyo (JP)

(72) Inventors: Gaku Yoshikawa, Osaka (JP); Masayuki Takashima, Osaka (JP); Kentaro Masui, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/329,000

(22) PCT Filed: Jul. 27, 2015

(86) PCT No.: PCT/JP2015/071274
§ 371 (c)(1),
(2) Date: Jan. 25, 2017

(87) PCT Pub. No.: WO2016/017592
PCT Pub. Date: Feb. 4, 2016

(65) Prior Publication Data
US 2017/0210899 A1   Jul. 27, 2017

(30) Foreign Application Priority Data
Jul. 28, 2014  (JP) .................................. 2014-153266

(51) Int. Cl.
*C08L 83/04* (2006.01)
*H01L 33/56* (2010.01)
(Continued)

(52) U.S. Cl.
CPC ............. *C08L 83/04* (2013.01); *H01L 27/156* (2013.01); *H01L 33/502* (2013.01); *H01L 33/56* (2013.01);
(Continued)

(58) Field of Classification Search
CPC ....... C09K 2200/0685; C08L 2205/025; C08L 2201/10; C08L 83/04; C08G 77/44
(Continued)

(56) References Cited

U.S. PATENT DOCUMENTS 8,329,290 B2   12/2012  Hirano
2001/0041769 A1*  11/2001  Iwasawa ............... C07F 7/0852
524/588
(Continued)

FOREIGN PATENT DOCUMENTS

EP   2530123 A2   12/2012
JP   2-11659 A    1/1990
(Continued)

OTHER PUBLICATIONS

Int'l Search Report dated Oct. 27, 2015 in Int'l Application No. PCT/JP2015/071274.
Search Report dated Jan. 2, 2018 in EP Application No. 15828281.

Primary Examiner — Christopher Raabe
(74) Attorney, Agent, or Firm — Panitch Schwarze Belisaro & Nadel LLP

(57) ABSTRACT

A silicone-based encapsulating material composition contains a bifunctional thermosetting silicone resin (A), a multifunctional thermosetting silicone resin having a hydroxyl group (B), and a curing catalyst (C). In the composition, a weight-average molecular weight of the component (A) is 300 to 4,500, a mass ratio of the component (B) relative to a total mass of the component (A) and the component (B) is 0.5% by mass or more and less than 100% by mass, an
(Continued)

average functional number of the component (B) is 2.5 to 3.5, and the repeating units constituting the component (B) which are trifunctional account for 50% by mass or more relative to a total mass of the component (B). A visible light transmittance measured at an optical path length of 1 cm and a wavelength of 600 nm is 70% or higher.

12 Claims, 6 Drawing Sheets

(51) Int. Cl.
  *H01L 33/50* (2010.01)
  *H01L 27/15* (2006.01)
(52) U.S. Cl.
  CPC ..... *C08L 2201/10* (2013.01); *C08L 2203/206* (2013.01); *C08L 2205/025* (2013.01)
(58) Field of Classification Search
  USPC ........................................................ 313/512
  See application file for complete search history.

(56) References Cited

U.S. PATENT DOCUMENTS

| | | | | |
|---|---|---|---|---|
| 2005/0065275 | A1* | 3/2005 | Takahashi | C08J 5/18 524/588 |
| 2009/0189510 | A1* | 7/2009 | Kanamori | C09D 143/04 313/498 |
| 2011/0098420 | A1* | 4/2011 | Takizawa | C08L 83/04 525/477 |
| 2013/0341671 | A1* | 12/2013 | Ona | H01L 33/56 257/100 |
| 2014/0001949 | A1 | 1/2014 | Kimura et al. | |
| 2014/0239335 | A1 | 8/2014 | Goto | |
| 2015/0140700 | A1* | 5/2015 | Sato | C09K 11/02 438/27 |
| 2015/0188007 | A1* | 7/2015 | Mochizuki | H01L 33/56 313/512 |
| 2015/0221837 | A1* | 8/2015 | Yonezaki | H01L 33/56 257/98 |
| 2015/0307717 | A1* | 10/2015 | Kojima | H01L 33/60 257/98 |
| 2015/0353740 | A1* | 12/2015 | Kojima | H01L 33/46 362/296.04 |

FOREIGN PATENT DOCUMENTS

| | | |
|---|---|---|
| JP | 2007-045971 A | 2/2007 |
| JP | 2010144135 A | 7/2010 |
| JP | 2012-238636 A | 12/2012 |
| JP | 2013-518144 A | 5/2013 |
| WO | 2013/047407 A1 | 4/2013 |

* cited by examiner

SILICONE-BASED ENCAPSULATING MATERIAL COMPOSITION AND SEMICONDUCTOR LIGHT-EMITTING DEVICE

CROSS-REFERENCE TO RELATED APPLICATION

This application is a Section 371 of Intl Application No. PCT/JP2015/071274, filed Jul. 27, 2015, which was published in the Japanese language on Feb. 4, 2016 under International Publication No. WO 2016/017592 A1, and the disclosure of which is incorporated herein by reference.

TECHNICAL FIELD

The present invention relates to a silicone-based encapsulating material composition and a semiconductor light-emitting device.

Priority is claimed on Japanese Patent Application No. 2014-153266, filed Jul. 28, 2014, the content of which is incorporated herein by reference.

BACKGROUND ART

In recent years, UV- (ultraviolet-) LEDs have started to appear on the market. Quartz glass is generally used for encapsulating UV-LEDs. However, quartz glass is expensive, and suffers from another problem in that the UV light extraction efficiency is low due to the refractive index. As a result, the encapsulating of UV-LEDs with resins such as epoxy resins and addition reaction-type silicone resins is now being investigated. However, when UV-LEDs are encapsulated with these types of resins, problems including low UV light transmittance and severe resin degradation tend to occur.

Encapsulating materials that use a condensation-type silicone resin have been proposed as silicone-based encapsulating material compositions capable of addressing the above problems. For example, a silicone-based encapsulating material composition containing: a bifunctional thermosetting silicone resin (A), a multifunctional thermosetting silicone resin (B), and a curing catalyst (C), wherein (A) and (B) are immiscible at 80° C., has been proposed (see Patent Document 1).

In the silicone-based encapsulating material composition of Patent Document 1, because (A) and (B) are immiscible at 80° C., (A) and (B) undergo phase separation in a melted system, and because the density of (B) is higher than the density of (A), the component (B) tends to settle down through the liquefied encapsulating material composition and accumulate in the vicinity of the bottom lead electrodes, and when subjected to a high-level crosslinking reaction, covers the surface of the lead electrodes with a layer having superior gas barrier properties.

PRIOR ART LITERATURE

Patent Documents

Patent Document 1: JP-2012-238636-A

DISCLOSURE OF INVENTION

Problems to be Solved by the Invention

However, the silicone-based encapsulating material composition disclosed in Patent Document 1 has unsatisfactory crack resistance in some cases.

The present invention has been developed in light of the above problems, and has objects of providing a silicone-based encapsulating material composition that yields a silicone-based encapsulating material having improved crack resistance, and providing a semiconductor light-emitting device having improved crack resistance.

Means for Solving the Problems

As a result of intensive investigations aimed at achieving the above objects, the inventors of the present invention completed the present invention described below. In other words, one aspect of the present invention provides a silicone-based encapsulating material composition comprising: a bifunctional thermosetting silicone resin (A), a multifunctional thermosetting silicone resin having a hydroxyl group (B), and a curing catalyst (C), wherein a weight-average molecular weight of (A) is 300 to 4,500, a ratio of (B) relative to a total mass of (A) and (B) is 0.5% by mass or more and less than 100% by mass, a functional number of (B) is 2.5 to 3.5, the repeating units constituting (B) which are trifunctional account for 50% or more, and a visible light transmittance measured at an optical path length of 1 cm and a wavelength of 600 nm is 70% or higher.

In one aspect of the present invention, the silicone-based encapsulating material composition may have a configuration in which y as the weight-average molecular weight of (A) and x as the number of hydroxyl groups per 100 silicon atoms in (B) satisfy the following formulae (F1) and (F2).

$$y < -60x + 4500 \tag{F1}$$

$$x > 0 \tag{F2}$$

In one aspect of the present invention, the silicone-based encapsulating material composition may be a two-liquid-type composition composed of a liquid composition comprising (A) and (B), and a liquid composition comprising (C).

In one aspect of the present invention, a ratio of (B) relative to a total mass of (A) and (B) may be 20 to 70% by mass.

In one aspect of the present invention, a ratio of (C) relative to a total mass of (A) and (B) may be 0.001 to 3.0% by mass.

In one aspect of the present invention, (C) may be a phosphoric acid-based catalyst. The phosphoric acid-based catalyst is described below in further detail.

In one aspect of the present invention, (C) may be an organic complex or an organic acid salt containing at least one metal selected from the group consisting of tin (Sn), zinc (Zn), iron (Fe), titanium, zirconium (Zr), bismuth (Bi), hafnium (HO), yttrium (Y), aluminum (Al), boron (B) and gallium (Ga) as a metal component.

In one aspect of the present invention, the silicone-based encapsulating material composition may have a configuration further comprising: a multifunctional thermosetting silicone oligomer having no hydroxyl group and having a weight-average molecular weight of 300 to 1,500 (D) in an amount of 0.5 to 20% by mass relative to a total mass of the component (A) and the component (B).

One aspect of the present invention provides a semiconductor light-emitting device comprising a substrate, a semiconductor light-emitting element disposed on the substrate, and an encapsulating portion provided covering a surface of the semiconductor light-emitting element, wherein a periphery of the semiconductor light-emitting element is enclosed and encapsulated by the substrate and the encapsulating portion, the material for forming the encapsulating portion comprises a cured product of a bifunctional thermosetting silicone resin (A') and a cured product of a multifunctional thermosetting silicone resin having a hydroxyl group (B'), and when an abundance ratio of (A') in the encapsulating portion relative to a total mass of (A') and (B') is compared at two points in a thickness direction between a surface of the semiconductor light-emitting element and a surface of the encapsulating portion, the abundance ratio at the point relatively closer to the surface of the semiconductor light-emitting element is at least as large as the abundance ratio at the point relatively closer to the surface of the encapsulating portion.

In other words, the present mention relates to the following.

[1] A silicone-based encapsulating material composition comprising: a bifunctional thermosetting silicone resin), a multifunctional thermosetting silicone resin having a hydroxyl group (B), and a curing catalyst (C), wherein a weight-average molecular weight of the component (A) is 300 to 4,500, a mass ratio of the component (B) relative to the total of a mass of the component (A) and a mass of the component (B) is 0.5% by mass or more and less than 100% by mass, an average functional number of the component (B) is 2.5 to 3.5, and the repeating units constituting the component (B) which are trifunctional account for 50% by mass or more relative to a total mass of the component (B), and a visible light transmittance measured at an optical path length of 1 cm and a wavelength of 600 nm is 70% or higher.

[2] The silicone-based encapsulating material composition according to wherein y as the weight-average molecular weight of the component (A) and x as the number of hydroxyl groups per 100 silicon atoms in the component (B) satisfy the following formulae (F1) and (F2).

$$y < -60x + 4500 \quad (F1)$$

$$x > 0 \quad (F2)$$

[3] The silicone-based encapsulating material composition according to [1] or [2], wherein the composition a two-liquid-type composition composed of a liquid composition comprising the component (A) and the component (B), and a liquid composition comprising the component (C).

[4] The silicone-based encapsulating material composition according to any one of [1] to [3], wherein a ratio of the component (B) relative to the total mass of the component (A) and the component (B) is 20 to 70% by mass.

[5] The silicone-based encapsulating material composition according to any one of [1] to [4], wherein a ratio of the component (C) relative to the total mass of the component (A) and the component (B) is 0.001 to 3.0% by mass.

[6] The silicone-based encapsulating material composition according to any one of [1] to [5], wherein the component (C) is a phosphoric acid-based catalyst.

[7] The silicone-based encapsulating material composition according to any one of [1] to [5], wherein the component (C) is an organic complex or an organic acid salt containing at least one metal selected from the group consisting of tin (Sn), zinc (Zn), iron (Fe), titanium (Ti), zirconium (Zr), bismuth (Bi), hafnium (Hf), yttrium (Y), aluminum (Al), boron (B) and gallium (Ga) as a metal component.

[8] The silicone-based encapsulating material composition according to any one of [1] to [7], further comprising: a multifunctional thermosetting silicone oligomer having no hydroxyl group and having a weight-average molecular weight of 300 to 1,500 (D) in an amount of 0.5 to 20% by mass relative to a total mass of the component (A) and the component (B).

[9] A composition for a phosphor sheet, the composition comprising the silicone-based encapsulating material composition according to any one of [1] to [8] and a phosphor.

[10] A phosphor sheet produced by using the composition for a phosphor sheet according to [9].

[11] A semiconductor light-emitting device comprising the phosphor sheet according to [10].

[12] A semiconductor light-emitting device comprising:
a substrate,
a semiconductor light-emitting element disposed on the substrate, and
an encapsulating portion provided covering the surface of the semiconductor light-emitting element, wherein
a periphery of the semiconductor light-emitting element is enclosed and encapsulated by the substrate and the encapsulating portion,
the encapsulating portion comprises a cured product of a composition comprising: a bifunctional thermosetting silicone resin (A), and a multifunctional thermosetting silicone resin having a hydroxyl group (B), and
when an abundance ratio of the component (A) in the encapsulating portion relative to a total mass of the component (A) and the component (B) is compared at two arbitrary points in a thickness direction between a surface of the encapsulating portion that contacts the semiconductor light-emitting element and a surface of the encapsulating portion that contacts the external atmosphere, the abundance ratio of the component (A) at the point closer to the surface that contacts the semiconductor light-emitting element is at least as large as the abundance ratio of the component (A) at the point closer to the surface that contacts the external atmosphere.

Effects of the Invention

The silicone-based encapsulating material composition according to the present invention forms a silicone-based encapsulating material upon curing that exhibits improved crack resistance, and is therefore useful. Further, the semiconductor light-emitting device according to the present invention has improved crack resistance and is also useful.

BEST MODE FOR CARRYING OUT THE INVENTION

Figure 1:
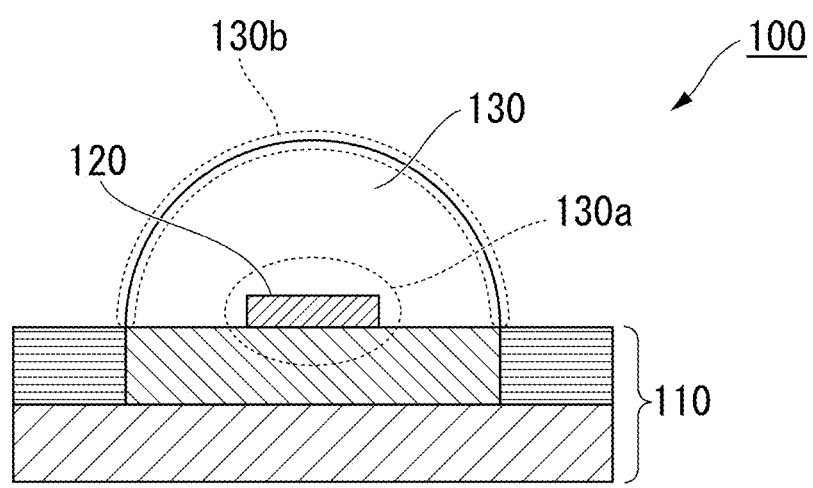
FIG. 1 is a cross-sectional view of a semiconductor light-emitting device according to one embodiment of the present invention.

The present invention is described below in further detail, but the present invention is in no way limited by the following embodiments, and various modifications are possible within the scope of the present invention.

One embodiment of the present invention provides a silicone-based encapsulating material composition comprising: a bifunctional thermosetting silicone resin (A), a multifunctional thermosetting silicone resin having a hydroxyl group (B), and a curing catalyst (C), wherein a weight-average molecular weight of the component (A) is 300 to 4,500, a ratio of the component (B) relative to a total mass of the component (A) and the component (B) is 0.5% by mass or more and less than 100% by mass, an average functional number of the component (B) is 2.5 to 3.5, the repeating units constituting the component (B) Which are trifunctional account for 50% by mass or more relative to a total mass of the component (B), and a visible light transmittance measured at an optical path length of 1 cm and a wavelength of 600 nm is 70% or higher. Each of the components of this embodiment are described below.

[Bifunctional Thermosetting Silicone Resin (A)]

In this description, a "bifunctional thermosetting silicone resin" describes an organic polymer (polyorganosiloxane) which has siloxane linages as the main chain, is represented by general composition formula (F3) shown below, and has an average functional number of about 2.

Here, "about 2" may be a number from 1.7 to 2.3.

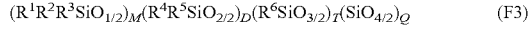

In formula (F3), each of $R^1$ to $R^6$ independently represents a hydrocarbon group such as an alkyl group or phenyl group, or a halogen atom. The alkyl group is preferably an alkyl group having 1 to 3 carbon atoms, and examples include a methyl group, ethyl group, propyl group and isopropyl group. Examples of the halogen atom include a fluorine atom, chlorine atom, bromine atom and iodine atom.

When any of $R^1$ to $R^6$ are halogen atoms, these atoms are considered oxygen atoms when counting the functional number.

Each of M, D, T and Q is 0 or more and less than 1, provided that M+D+T+Q=1.

The repeating units constituting the polyorganosiloxane represented by the above formula (F3) include monofunctional units $[R^1R^2R^3SiO_{1/2}]$ (triorganosilhemioxanes), bifunctional units $[R^4R^5SiO_{2/2}]$ (diorganosiloxanes), trifunctional units $[R^6SiO_{3/2}]$ (organosilsesquioxanes) and tetrafunctional units $[SiO_{4/2}]$ (silicates), and the functional number of the polyorganosiloxane (namely, the average functional number) is determined on the basis of the compositional ratio between these four types of repeating units.

In other words, the functional number of the polyorganosiloxane of the above formula (F3) (namely, the average functional number) can be calculated by formula (F4) shown below.

Functional number for polyorganosiloxane (average functional number)=$(1 \times M+2 \times D+3 \times T+4 \times Q)/(M+D+T+Q)$ (F4)

A typical bifunctional thermosetting silicone resin is a polyorganosiloxane in which all of the repeating units in the above formula (F3) are $(R^4R^5SiO_{2/2})$, namely a polyorganosiloxane composed solely of diorganosiloxane structures ($-$O$-$Si$(R^4)(R^5)-$O$-$), and the functional number (namely, the average functional number) in this case is 2.0.

The present embodiment is not limited to only the types of typical bifunctional thermosetting silicone resins described above, and other thermosetting silicone resins having an average functional number of about 2 can be used, but the use of a silanol-terminated diorganosiloxane is preferable.

Further, a resin having a weight-average molecular weight of 300 to 4,500 is used as the bifunctional thermosetting silicone resin (A) of the present embodiment. The weight-average molecular weight of the bifunctional thermosetting silicone resin (A) may, for example, be 500 to 4,500, or 800 to 4,000. If the molecular weight is too small, then the volatilization volume during heat curing increases, and there is a possibility that the component (A) may not be contained in the cured product in an adequate amount. Further, if the molecular weight is too large, then there is a possibility of a deterioration in the miscibility.

In other words, provided the weight-average molecular weight of the bifunctional thermosetting silicone resin (A) is at least as large as the abovementioned lower limit, the volatilization volume during heat curing is not too great, and the component (A) can be more easily incorporated in the cured product. Further, provided the molecular weight is not more than the upper limit, the miscibility is favorable.

Further, in the bifunctional thermosetting silicone resin (A), from the viewpoint of ensuring favorable miscibility, the amount of components having a molecular weight exceeding a prescribed molecular weight is preferably small. Specifically, in a GPC (gel permeation chromatography) analysis, the molecular weight where the fractionation range reaches 5% on the high molecular weight side is preferably 6,500 or less, and more preferably 5,500 or less.

In another aspect, in a GPC analysis, if the molecular weight where the fractionation range reaches 5% on the high molecular weight side is deemed Y, and the weight-average molecular weight is deemed X, then the value of Y/X of the bifunctional thermosetting silicone resin (A) is preferably 1.25 to 3, and is more preferably 1.5 to 2.5.

Generally, a value obtained by measurement by a gel permeation chromatography (GPC) method can be used as the weight-average molecular weight. Specifically, a sample of the polymer that is to be measured is dissolved in a suitable solvent, the solution is then passed through a column using a filler having a multitude of pores together with a mobile phase solution, thereby fractionating the polymer inside the column based on the size of the molecular weight, and the fractionated products are detected using a detector such as a differential refractometer, UV meter, viscometer or light scattering detector. The weight-average molecular weight is generally expressed as a polystyrene-equivalent value referenced against standard polystyrenes. In this description, weight-average molecular weights are expressed as these polystyrene-equivalent values. The column used may be selected appropriately in accordance with the anticipated molecular weight.

In the GPC measurement, solvent used for dissolving the silicone resin or silicone oligomer is preferably the same solvent as that used for the mobile phase solvent used during the GPC measurement, and specific examples include, tetrahydrofuran, chloroform, toluene xylene, dichloromethane, dichloroethane, methanol, ethanol and isopropyl alcohol.

[Multifunctional Thermosetting Silicone Resin (B)]

In this description, the multifunctional thermosetting silicone resin (B) (hereinafter also referred to as "component (B)") means a thermosetting silicone resin of the above formula (F3) in which the functional number (namely, the average functional number) exceeds 2. In the present embodiment, a resin having an average functional number of 2.5 to 3.5 and having a hydroxyl group is used as the multifunctional thermosetting silicone resin. The number of hydroxyl groups is, for example, 1 to 75 groups, preferably 5 to 50 groups, and more preferably 10 to 30 groups, per 100 silicon atoms constituting the component (B). From the viewpoint of enhancing the adhesiveness to substrates, and the viewpoint of increasing the number of reactive sites to ensure that the reaction with the component (A) proceeds satisfactorily, the umber of hydroxyl groups is preferably at least 1. From the viewpoint of controlling the condensation reaction, and the viewpoint of controlling volumetric shrinkage during curing, which can cause cracking, the number of hydroxyl groups is preferably 75 or less. Further, a multifunctional thermosetting silicone resin in which the repeating units constituting the component (B) which are trifunctional account for 50% by mass to 100% by mass relative to the total mass of the component (B) is used as the component (B).

A typical trifunctional thermosetting silicone resin composed of trifunctional repeating units is a polyorganosiloxane in which all of the repeating units in the above formula (F3) are represented by ($R^6SiO_{3/2}$), namely a polyorganosiloxane composed solely of organosilsesquioxane structures (—O—Si(O—)($R^6$)—O—), and the functional number (namely, the average functional number) in this case is 3.0.

The weight-average molecular weight of the component (B) may, for example, be 2,000 to 20,000.

The present embodiment is not limited to only the types of typical trifunctional thermosetting silicone resins described above, and other thermosetting silicone resins having an average functional number of about 3 (namely, an average functional number of 2.5 to 3.5) may also be used.

[Curing Catalyst (C)]

There are no particular limitations on the curing catalyst, provided it is a curing catalyst capable of promoting the condensation reaction of the silicone resins. Examples of the curing catalyst include inorganic acids such as hydrochloric acid, sulfuric acid, nitric acid and phosphoric acid; organic acids such as formic acid, acetic acid, oxalic acid, citric acid, propionic acid, butyric acid, lactic acid and succinic acid; alkaline compounds such as ammonium hydroxide, tetramethylammonium hydroxide and tetraethylammonium hydroxide; and organometallic compound catalysts such as organic complexes or organic acid salts containing at least one metal selected from the group consisting of tin (Sn), zinc (Zn), iron (Fe), titanium (Ti), zirconium (Zr), bismuth (Bi), hafnium (Hf), yttrium (Y), aluminum (Al), boron (B) and gallium (Ga) as a metal component.

Among these, Sn, Ti, Zn, Zr, Hf and Ga are preferable in terms of exhibiting superior reactivity. Of these, Zr, Hf and Ga are particularly preferred because they cause minimal electrode corrosion or light absorption when used in light-emitting devices, have an appropriate level of catalytic activity, and are unlikely to cause unnecessary degradation arising from severing of the polysiloxane chain.

Examples of organometallic compound catalysts containing tin (Sn) include tetraalkyl tin, dialkyl tin oxide and dialkyl tin dicarbonate (wherein the number of carbon atoms in the alkyl groups and the carboxylic acids are preferably 1 to 10).

Examples of organometallic compound catalysts containing titanium (Ti) include tetraalkoxy titanium or oligomers thereof (wherein the number of carbon atoms in the alkyl groups is preferably 3 to 8) and titanium acetylacetonate.

Examples of organometallic compound catalysts containing zinc (Zn) include zinc triacetylacetonate, zinc stearate and bis(acetylacetonato)zinc(II) (monohydrate).

Examples of organometallic compound catalysts containing zirconium (Zr) include zirconium tetraacetylacetonate, zirconium dibutoxy diacetylacetonate, zirconium tetraalkoxide (wherein the number of carbon atoms in the alkyl groups is preferably 3 to 8), zirconyl (2-ethylhexanoate) and zirconium (2-ethylhexanoate).

Examples of organometallic compound catalysts containing hafnium (Hf) include compounds having similar structures to the above zirconium compounds.

Examples of organometallic compound catalysts containing gallium (Ga) include gallium triacetylacetonate, gallium trialkoxide (wherein the number of carbon atoms in the alkyl groups is preferably 2 to 8), gallium octoate, gallium laurate and gallium acetate.

Further, among the inorganic acids, phosphoric acid-based catalysts are preferable from the viewpoints of miscibility with the silicone components and the curing promotion properties. Examples of phosphoric acid-based catalysts include compounds represented by formula (1) or formula (2) shown below. In the formulae, M represents a counter cation, * represents another atom or atom grouping, and n is an integer of 0 to 2. When a plurality of M exists, the M moieties may be the same or different. When a plurality of * exists, the * moieties may be the same or different.

An example of the above counter cation is a hydrogen ion. Examples of the atom or atom grouping represented by * include OR and R. Here, R represents a monovalent organic group, and examples include a methyl group, ethyl group, propyl group or butyl group. Specific examples of the phosphoric acid-based catalyst include phosphoric acid, phosphorous acid, phosphate esters and phosphite esters.

[Chemical formula 1]

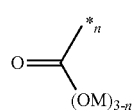

(1)

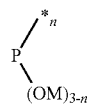

(2)

In order to enable the curing catalyst to be added in a prescribed concentration, the curing catalyst may be added to the silicone-based encapsulating material composition in a dilute state within an organic solvent or a silicone monomer or silicone oligomer or the like that is easily blended with the silicone-based encapsulating material composition.

A single type of curing catalyst may be used alone, or an arbitrary combination of two or more types in an arbitrary ratio may be used. Further, the curing catalyst may also be used in combination with a reaction promoter or a reaction inhibitor.

The amount (concentration) of the curing catalyst may be set as appropriate with due consideration of factors such as the heating temperature during the curing reaction, the reaction time and the type of catalyst. For example, the amount is typically 0.001 to 3.0% by mass, and preferably 0.001 to 1.5% by mass, relative to the total mass of the component (A) and the component (B). Here, the concentration of the catalyst represents the mass % of the acid, base or metal compound that acts as the catalyst, and does not include the amount of the solvent in those cases where the catalyst is diluted with a solvent.

When an organometallic compound catalyst is used as the curing catalyst, the amount of the curing catalyst is preferably 0.001 to 0.5% by mass (calculated as the equivalent mass of metal atoms), and more preferably 0.003 to 0.2% by mass, relative to the total mass of the component (A) and the component (B). The amount of the organometallic compound catalyst can be measured by high-frequency inductively coupled plasma (ICP) analysis of the catalyst metal component.

When a phosphoric acid-based catalyst is used as the curing catalyst, the amount of the curing catalyst is preferably 0.1 to 3.0% by mass, and more preferably 0.2 to 1.5% by mass, relative to the total mass of the component (A) and the component (B).

The curing catalyst may be added to the silicone-based encapsulating material composition immediately prior to performing the curing reaction, or may be contained in the original silicone-based encapsulating material composition.
[Other Components]

The silicone-based encapsulating material composition of the present embodiment may also comprise other components. Examples of these other components include silicone oligomers, inorganic particles, phosphors, silane coupling agents and curing catalysts.
(Multifunctional Thermosetting Silicone Oligomer Having No Hydroxyl Group and Having a Weight-Average Molecular Weight of 300 to 1,500 (D))

Examples of the silicone oligomers include multifunctional thermosetting silicone oligomers having no hydroxyl group and having a weight-average molecular weight of 300 to 1,500 (hereinafter also referred to as "component (D)"), and for example, thermosetting silicone oligomers of the above formula (F3) with a functional number (average functional number) exceeding 2, having no hydroxyl group, and having a weight-average molecular weight of 300 to 1,500 can be used. The functional number (average functional number) in the component (D) is preferably 2.5 to 3.5.

Provided the weight-average molecular weight of the component (D) is 1,500 or less, the crack resistance of the cured product (namely, the silicone-based encapsulating material) of the silicone-based encapsulating material composition tends to improve further. The weight-average molecular weight of the component (D) may, for example, be 300 to 800, or 350 to 700.

The amount added of the component (D) is preferably 0.5 to 20% by mass, and more preferably 1 to 15% by mass, relative to the total mass of the component (A) and the component (B).

By including the component (D) described above in the silicone-based encapsulating material composition, the crack resistance and the adhesiveness tend to improve, without impairing the gas barrier properties of the silicone-based encapsulating material. The reasons why adding the component (D) improves the crack resistance and the adhesiveness to other materials of the obtained silicone-based encapsulating material are not entirely clear, but it is surmised that the low-molecular weight silicone oligomer (component (D)) bonds in a manner that facilitates cross-linking between polymer molecules of the component (A), which results in improved flexibility, as well as an increase in the polarity of the overall silicone-based encapsulating material composition due to the functional groups in the component (D), thereby enhancing the adhesiveness to other materials.

The silicone oligomer (component (D)) can be synthesized using an organosilicon compound having a functional group that can generate a siloxane linkage as a starting material, by performing a reaction by a hydrolysis-condensation method. Further, silicone oligomers synthesized in this manner are also industrially available.

There are no particular limitations on the method used for mixing the component (A), the component (B) and the component (D), and any conventional method typically used for mixing two or more polymer compounds may be used. For example, the component (A), the component (B) and the component (D) (and other resins as required) can be mixed by simultaneously or sequentially dissolving the components in an organic solvent.

From the viewpoints of enabling more uniform mixing of the various components and improving the stability of the resulting solution (resin solution) comprising the mixed components, it is preferable that the component (A), the component (B) and the component (D) are first dissolved in an organic solvent having high levels of volatility and dissolution, and the solvent is then substituted with another solvent. Specifically, first, the component (A) is added to an organic solvent having high volatility (hereinafter also referred to as the organic solvent P) and is dissolved by heating and stirring the solvent at a temperature close to the boiling point of the organic solvent P. Next, the component (B) is added, nixed and dissolved in a similar manner. The component (D) is then also added, mixed and dissolved in a similar manner. Subsequently, a solvent (hereinafter also referred to as the organic solvent Q) having lower volatility than the organic solvent P is added, and a solvent substitution from the organic solvent P to the organic solvent Q is performed by heating the solution until the concentration of the organic solvent P falls to 1% or less. In order to facilitate a more efficient solvent substitution, heating may be performed with the inside of the vessel under a state of reduced pressure.

Residual solvent from the synthesis of the component (A), the component (B) and the component (D), and unreacted residual water or the like can also be removed during the solvent substitution, and therefore performing this type of process is effective in improving the stability of the resin solution.

The organic solvent P is preferably an organic solvent having a boiling point of less than 100° C. Specific examples include ketone-based solvents such as acetone and methyl ethyl ketone; alcohol-based solvents such as methanol, ethanol, isopropyl alcohol and normal-propyl alcohol; hydrocarbon-based solvents such as hexane, cyclohexane, heptane and benzene; acetate ester-based solvents such as methyl acetate and ethyl acetate; and ether-based solvents such as dimethyl ethyl ether and tetrahydrofuran. Among these, alcohol-based solvents and ester-based solvents are preferable.

The organic solvent Q is preferably an organic solvent having a boiling point of 100° C. or higher. Specific examples include glycol ether-based solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol monoethylhexyl ether, propylene glycol monophenyl ether, propylene glycol monobenzyl ether, dipropylene glycol monomethyl ether, dipropylene glycol monoethyl ether, dipropylene glycol monoisopropyl ether, dipropylene, glycol monobutyl ether, dipropylene glycol monohexyl ether, dipropylene glycol monoethylhexyl ether, dipropylene glycol monophenyl ether and dipropylene glycol monobenzyl ether; and glycol ester-based solvents in which an acetate group has been added to one of the above glycol ether-based solvents, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate. Among these, glycol ester-based solvents are preferable.

(Inorganic Particles, Phosphors)

Phosphors which emit fluorescence upon light irradiation and inorganic particles may be contained in the silicone-based encapsulating material composition as other components. This enables the obtained silicone-based encapsulating material to enhance the intensity of the light from a light-emitting element. The inorganic particles have a function of scattering light inside the silicone-based encapsulating material, thereby effectively exciting the phosphor, a function of preventing the phosphor from settling down through the silicone-based encapsulating material composition, a function of adjusting the viscosity of the silicone-based encapsulating material composition, and a function of improving the light scattering properties, refractive index, dimensional stability and mechanical strength of the obtained silicone-based encapsulating material.

When a phosphor and inorganic particles are mixed into the silicone-based encapsulating material composition, the phosphor is prone to settling, and therefore it is preferable that the inorganic particles are first added and mixed, the phosphor is then mixed, and the composition is then used promptly for encapsulating the optical semiconductor element.

Examples of preferred inorganic particles include oxides of silicon, titanium, zirconium, aluminum, iron and zinc and the like, carbon black, barium titanate, calcium silicate and calcium carbonate. Among these, silicon oxides, titanium oxides and aluminum oxides are particularly preferred. Moreover, from the viewpoint of achieving low absorption of UV light, silicon and aluminum oxides are preferable.

Examples of the form of the inorganic particles include spherical, plate-like, columnar, needle-like, whisker-like and fibrous particles.

Either one type, or two or more types, of inorganic particles composition may be used. Further, the inorganic particles preferably comprise inorganic particles having two or more different particle sizes, and more preferably comprise at least two types of particles including inorganic particles A having a primary particle average particle size of 100 to 500 nm and inorganic particles B having a primary particle average particle size of less than 100 nm. By including two or more types of inorganic particles having different primary particle average particle sizes, the efficiency of the excitation of the phosphor by scattered light can be further improved, and the effect of the inorganic particles in preventing settling of the phosphor can be better realized.

Here, the primary particle average particle size can be determined by an imaging method or the like in which an electron microscope or the like is used to view the particles directly. Specifically, a sample prepared by placing the inorganic particles to be measured into an arbitrary solvent, performing irradiation with ultrasound or the like to thoroughly disperse the particles, and then dripping the liquid onto a slide glass or the like and performing drying, or a sample prepared by adhering the inorganic particles directly to the adhesive surface of an adhesive tape by sprinkling the particles onto the tape, is inspected using a scanning electron microscope (SEM) or a transmission electron microscope (TEM) or the like, and the primary particle average particle size is then determined by calculating the dimensions of the particles from the particle shapes. For example, the projected area of an inorganic particle may be determined, and the diameter of a circle corresponding with that area then calculated and recorded as the particle size. In this case, the particle size is determined for 100 or more particles (and preferably 100 particles), and the arithmetic mean may then be calculated and recorded as the average particle size.

There are no particular limitations on the amount of inorganic particles, and for example, an amount of 0.01 to 10% by mass, or 0.1 to 5% by mass, relative to the total mass of the component (A) and the component (B) may be used.

Further, there are no particular limitations on the composition or type of phosphor used, and examples include red phosphors that emit fluorescence in a wavelength range from 570 to 700 nm, green phosphors that emit fluorescence in a wavelength range from 490 to 570 nm, and blue phosphors that emit fluorescence in a wavelength range from 420 to 480 nm. Further, a plurality of phosphors may also be mixed, depending on the brightness or color required. Specific examples of the above types of phosphor include YAG-based phosphors such as $Y_3(Al,Ga)_5O_{12}$:Ce, $(Y,Gd)_3Al_5O_{12}$:Ce, $Lu_3Al_5O_{12}$:Ce and $Y_3Al_5O_{12}$:Ce; TAB-based phosphors such as $Tb_3Al_5O_{12}$:Ce; silicate-based phosphors such as $(Ba,Sr)SiO_4$:Eu, $Ca_3Sc_2Si_3O_{12}$:Ce and $(Sr,Ba,M)_2SiO_4$; nitride-based phosphors such as $(Ca,Sr)_2Si_5N_8$:Eu, $(Ca,Sr)AlSiN_3$:Eu and $CaSiAlN_3$:Eu; oxynitride-based phosphors such as $Ca_x(Si,Al)_{12}(O,N)_{16}$:Eu (so-called α-SiAlON), $(Si,Al)_6(O,N)_8$:Eu (so-called β-SiAlON) and $BaSi_2O_2N_2$:Eu; as well as $(Ba,Sr,Ca)Si_2O_2N_2$:Eu-based phosphors, $Ca_8MgSi_4O_{16}Cl_2$:Eu-based phosphors and other phosphors such as $SrAl_2O_4$:Eu and $Sr_4Al_{14}O_{25}$:Eu.

The above value of x is 0.75 to 1.00.

There are no particular limitations on the amount of phosphor used, and the amount may be adjusted appropriately in accordance with factors such as the amount of light emitted by the light-emitting element, and the color and brightness required as a semiconductor light-emitting device. The amount of the phosphor is typically 0.5 to 2,000 parts by mass, and preferably 5 to 1,000 parts by mass, per 100 parts by mass of the composition excluding the phosphor. Provided the amount is 0.5 parts by mass or more, satisfactory wavelength conversion can be achieved.

There are no particular limitations on the particle size of the phosphor, but phosphors having a volume-based particle size distribution, obtained by measuring the phosphor using a laser diffraction and scattering particle size distribution measurement method, in which the particle size when the cumulative distribution from the small particle size side reaches 50% (namely, D50) is 0.05 to 50 μm can be used favorably, and phosphors having a D50 particle size of 3 to 2.0 μm can be used particularly favorably. Provided D50 is 0.05 μm or more, favorable dispersibility can be maintained, and any deterioration in the spectral conversion of the emitted light or the efficiency can be suppressed. On the other hand, provided D50 is 50 μm or less, settling of the phosphor can be suppressed, and as a result, fluctuations in the light emission can be suppressed.

(Silane Coupling Agents)

Silane coupling agents have the effect of improving the adhesion between the silicone-based encapsulating material cured product which represents one aspect of the present invention, and semiconductor light-emitting elements or packages. Silane coupling agents having at least one group selected from the group consisting of a vinyl group, epoxy group, styryl group, methacrylic group, acrylic group, amino group, ureido group, mercapto group, sulfide group and isocyanate group are preferable, and of these, coupling agents having an epoxy group or a mercapto group are particularly preferred. Specifically, 2-(3,4 epoxycyclohexyl) ethyltrimethoxysilane 3-glycidoxypropylmethyldimethoxysilane, 3-glycidoxypropyltrimethoxysilane, 3-glycidoxypropylmethyldiethoxysilane, glycidoxypropyltriethoxysilane, 3-mercaptopropylmethyldimethoxysilane and 3-mercaptopropyltrimethoxysilane are preferred.

The amount of the silane coupling agent may be 0.0001 to 1.0 parts by mass (solid fraction), or 0.001 to 0.5 parts by mass, per 100 parts by mass of the solid fraction of the silicone-based encapsulating material composition.

This silane coupling agent may be mixed into the silicone-based encapsulating material composition, or alternatively, the silane coupling agent may be applied in advance, by coating or an immersion treatment, to the surface of the semiconductor light-emitting, device or package, and the silicone-based encapsulating material subsequently formed and cured by potting or the like.

(Other Additives)

The silicone-based encapsulating material composition may also comprise modifying silicone compounds different from the component (A), the component (B) and the component (D), as well as other additives.

Examples of the modifying silicone compounds include typical silicone compounds available industrially. By adding a modifying silicone compound, for example, flexibility can be imparted to the silicone-based encapsulating material.

The amount of such modifying silicone compounds in the silicone-based encapsulating material composition is preferably 0.1 to 20 parts by mass (solid fraction), and more preferably 0.5 to 10 parts by mass, per 100 parts by mass of the solid fraction of the silicone-based encapsulating material composition.

Examples of the abovementioned additives include antifoaming agents or the like used for suppressing gas bubble formation during mixing of the silicone-based encapsulating material composition that represents one embodiment of the present invention. The amount of such an antifoaming agent in the silicone-based encapsulating material composition is preferably 0.01 to 3 parts by mass (solid fraction), and more preferably 0.01 to 1 part by mass, per 100 parts by mass of the solid fraction of the silicone-based encapsulating material composition.

[Silicone-Based Encapsulating Material Composition]

In the silicone-based encapsulating material composition according to one embodiment of the present invention, the amount of the component (B) relative, to the total mass of the bifunctional thermosetting silicone resin (A) and the multifunctional thermosetting silicone resin (B) having a hydroxyl group is typically 0.5% by mass and less than 100% by mass, and is preferably 10 to 80% by mass, more preferably 10 to 75% by mass, and even more preferably 20 to 70% by mass.

If the amount of the component (B) is less than 0.5% by mass, then the gas barrier properties of the silicone-based encapsulating material are insufficient, and the gloss retention characteristics of the lead electrodes tend to deteriorate. Further, because the amount of the crosslinking component is small, sufficient hardness may not be obtainable. On the other hand, if the amount of the component (B) reaches 100% by mass, then the curing rate increases dramatically, meaning the controllability of the curing reaction deteriorates, and the hardness following curing tends to increase, causing a deterioration in the crack resistance of the silicone-based encapsulating material. In other words, when the amount of the component (B) is 0.5% by mass or more, the gas barrier properties of the silicone-based encapsulating material are satisfactory, and favorable lead electrode gloss retention characteristics can be obtained. Further, because the amount of the crosslinking component is sufficiently large, satisfactory hardness can be achieved. When the amount of the component (B) is less than 100% by mass, the curing rate can be prevented from becoming too rapid, enabling more favorable reaction controllability, and the hardness following curing does not become too high, meaning the crack resistance of the silicone-based encapsulating material is favorable.

Compared with the component (B), the component (A) exhibits less shrinkage and undergoes stress relaxation more readily, and therefore it is thought that by using a combination of the component (A) and the component (B), the crack resistance of the silicone-based encapsulating material can be improved.

In the silicone-based encapsulating material composition according to one embodiment of the present invention, the component (A) and the component (B) are miscible at 25 to 200° C. Here, whether "the component (A) and the component (B) are miscible" can be determined, for example, by mixing equal amounts of the component (A) and the component (B), and ascertaining whether the two components form a single uniform phase, without any turbidity or phase separation, when stirring is performed at 80° C. More simply, the visible light transmittance may be measured at an optical path length of 1 cm and a wavelength of 600 nm, and the two components determined as miscible if the transmittance is 70% or higher.

In other words, in the present description, "the component (A) and the component (B) are miscible" means that the silicone-based encapsulating material composition that represents one embodiment of the present invention has a visible light transmittance (optical path length: 1 cm) measured at a wavelength of 600 nm that is 70% or higher in the temperature range from normal temperature to the curing temperature (for example, in a range from 25 to 200° C.). The light transmittance of light having a wavelength of 600 nm can be measured using a typical spectrophotometer.

In the silicone-based encapsulating material composition that represents one embodiment of the present invention, because the component (A) and the component (B) are miscible, when the silicone-based encapsulating material is formed, curing can be performed with the ratio (mass ratio) between the component (A) and the component (B) at any arbitrary location, for example in an upper surface (outer surface) portion or a lower surface (bottom surface) portion of the silicone-based encapsulating material, maintained at a substantially uniform level. It is thought that this enables the crack resistance of the silicone-based encapsulating material to be further improved.

Strictly speaking, the bifunctional thermosetting silicone resin (A) volatilizes more readily than the multifunctional thermosetting silicone resin (B) having a hydroxyl group. As a result, the abundance ratio of the component (A) is slightly higher in the lower surface portion of the silicone-based encapsulating material compared with the upper surface portion.

As described below, the site-specific abundance ratio (mass ratio) between the component (A) and the component (B) in the silicone-based encapsulating material can be measured based on the difference in the peak position in the infrared absorption spectrum of the peak attributable to the ≡Si-Me linkage (wherein Me represents a methyl group).

For example, one example of the component (B) described below has an infrared absorption spectrum peak position attributable to the ≡Si-Me linkage at 1269 cm$^{-1}$. Further, one example of the component (A) described below has an infrared absorption spectrum peak position attributable to the ≡Si-Me linkage at 1257 cm$^{-1}$.

Accordingly, by measuring the infrared absorption spectrum at any arbitrary location in the silicone-based encapsulating material obtained by curing the silicone-based encapsulating material composition comprising the component (A) and the component (B), two peaks attributable to the ≡Si-Me linkages are obtained. The intensity ratio between these two peaks reflects the abundance ratio (mass ratio) between the component (A) and the component (B) at that location.

For example, when the infrared absorption spectrum is measured for samples from a plurality of locations in the silicone-based encapsulating material, two peaks attributable to the ≡Si-Me linkages are obtained for each sample. In the case of a silicone-based encapsulating material obtained by curing a silicone-based encapsulating material composition comprising the component (A) and the component (B) mentioned above, peaks are obtained at 1269 cm$^{-1}$ and 1257 cm$^{-1}$.

For example, based on the peaks at 1269 cm$^{-1}$ and 1257 cm$^{-1}$ obtained for a sample from the upper surface portion in the silicone-based encapsulating material, and peaks at 1269 cm$^{-1}$ and 1257 cm$^{-1}$ obtained for a sample from the lower surface portion in the silicone-based encapsulating material, the abundance ratio of the component (A) and the component (B) in the upper surface portion and the lower surface portion in the silicone-based encapsulating material can be determined.

Specifically, by subjecting the graph of the infrared absorption spectrum of the sample from the upper surface portion to an expansion or contraction by a fixed ratio in the direction of the vertical axis, the intensity of the peak at 1269 cm$^{-1}$ is matched with the peak intensity of the peak at 1269 cm$^{-1}$ in the graph of the infrared absorption spectrum of the sample from the lower surface portion. The resulting ratio between the intensity of the peak at 1257 cm$^{-1}$ attributable to the sample from the upper surface portion and the intensity of the peak at 1257 cm$^{-1}$ attributable to the sample from the lower surface portion corresponds with the ratio between the abundance (mass) of the component (A) that exists in the sample from the upper surface portion and the abundance (mass) of the component (A) that exists in the sample from be lower surface portion.

In this manner, at any arbitrary location in the silicone-based encapsulating material, the abundance ratio between the component (A) and the component (B) at that location can be measured.

(Weight-Average Molecular Weight of Component (A) and Number of Hydroxyl Groups in Component (B))

One aspect of the silicone-based encapsulating material composition according to one embodiment of the present invention may have a configuration in which y as the weight-average molecular weight of the component (A) and x as the number of hydroxyl groups per 100 silicon atoms in the component (B) satisfy the following formulae (F1) and (F2).

$$y < -60x + 4500 \tag{F1}$$

$$x > 0 \tag{F2}$$

As described below, the inventors of the present invention discovered that in the range where the abovementioned y and x satisfy the above formula (F1), the component (A) and the component (B) tend to be miscible. Further, they also discovered that when the above formula (F2) is satisfied, superior mechanical strength and adhesiveness to substrates can be obtained.

In other words, by selecting the component (A) and the component (B) so that the abovementioned y and x satisfy the above formulae (F1) and (F2), a silicone-based encapsulating material composition can be produced which yields a silicone-based encapsulating material upon curing that exhibits excellent crack resistance.

[Silicone-Based Encapsulating Material Composition]

The silicone-based encapsulating material composition that represents one embodiment of the present invention can be produced by adding and blending the various components described above in their preferred respective amounts.

This type of silicone-based encapsulating material composition may be formed as either a one-liquid-type composition comprising all of the above components (A) to (C), or a two-liquid-type composition composed of a first liquid composition comprising the component (A) and the component (B), and a second liquid composition comprising the component (C).

In those cases where at least one of the two liquid compositions does not become a liquid at normal temperature even when the various components are mixed at the prescribed mixing ratio, or in those cases where two liquids are used and the volumes used of the two liquids are extremely different, an appropriate amount of an organic solvent may also be used to achieve a stable liquid composition, or achieve a better balance in the volumes used of the two compositions. An organic solvent may be used particularly in those cases where the concentration of the component (B) is high, for the purpose of adjusting the viscosity of the liquid composition to improve the workability.

The type of organic solvent and the amount used may be determined in accordance with the purpose of the solvent, and for example, the organic solvent is preferably selected so that the boiling point of the liquid composition is 40 to 250° C., and preferably 100 to 230° C. Further, the amount of solvent used is preferably kept as small as possible, and at most is preferably about 30% by weight relative to the total mass of the liquid composition.

[Silicone-Based Encapsulating Material]

Examples of the conditions used for curing the silicone-based encapsulating material composition that represents one embodiment of the present invention include a method that involves heating at 40 to 250° C. for a period of 5 minutes to 6 hours. For example, following addition of the curing catalyst (C) to the silicone-based encapsulating material composition, curing may be performed by leaving the composition to stand for 0.5 to 15 hours in an atmosphere at a temperature of 250° C. or less, or by leaving the composition to stand for 0.5 to 15 hours in an atmosphere at a temperature of 40 to 200° C. further, during curing, in order to remove solvents and water that exist in the silicone-based encapsulating material composition, and better control the condensation reaction rate of the silicone resins, the composition may be cured in a stepwise manner, for example at 40 to 60° C. for 5 to 30 minutes, subsequently at 60 to 100° C. for 10 to 60 minutes, and then at 140 to 200° C. for 30 minutes to 5 hours.

The silicone-based encapsulating material obtained by curing the silicone-based encapsulating material composition according to one embodiment of the present invention exhibits superior UV light transmittance, suffers little UV light degradation, and has excellent crack resistance. Further, compared with UV-LEDs encapsulated with quartz glass, the UV light extraction efficiency is higher, and the cost is lower.

<Composition for Phosphor Sheet, Phosphor Sheet>

A composition for a phosphor sheet according to one embodiment of the present invention is characterized by including a phosphor in the silicone-based encapsulating material composition of the embodiment of the present invention described above. Further, a phosphor sheet according to one embodiment of the present invention is a phosphor sheet that uses the above composition for a phosphor sheet.

In this description, a "phosphor sheet" means a sheet-like molded body that comprises a phosphor, and may be a sheet comprising at least the components (A) to (C) and a phosphor, or a sheet comprising a cured product of these components. The phosphor sheet may also comprise other components as required.

Although there are no particular limitations on the amount of the phosphor contained in the phosphor sheet, from the viewpoint of enhancing the efficiency of the wavelength conversion of the light emitted from the semiconductor light-emitting element, if the amount of the composition comprising the mixed components (A) to (C) (namely, the total amount of the components (A) to (C)) is deemed 100 parts by mass, then the amount of the phosphor is preferably 40 parts by mass or more, and more preferably 60 parts by mass or more. There are no particular limitations on the upper limit for the amount of phosphor, but from the viewpoint of making it easier to produce a phosphor sheet having excellent workability, if the amount of the composition comprising the mixed components (A) to (C) (namely, the total amount of the components (A) to (C)) is deemed 100 parts by mass, then the amount of the phosphor is preferably 2,000 parts by mass or less, and more preferably 1,000 parts by mass or less. In other words, if the amount of the composition comprising the mixed components (A) to (C) (namely, the total amount of the components (A) to (C)) is deemed 100 parts by mass, then the amount of the phosphor contained in the phosphor sheet is preferably 40 to 2,000 parts by mass, and more preferably 60 to 1,000 parts by mass. By ensuring that the amount of the phosphor in the phosphor sheet satisfies the above range, a light-emitting device having excellent performance can be obtained.

The film thickness of the phosphor sheet may be adjusted appropriately in accordance with the amount of phosphor and the desired optical characteristics. As described above, there is a limit to the amount of the phosphor from the viewpoint of workability, and therefore the film thickness is preferably 1 µm or more, and more preferably 10 µm or more. On the other hand, from the viewpoint of enhancing the optical characteristics and heat dissipation of the phosphor sheet, the film thickness of the phosphor sheet is preferably 1,000 µm or less, more preferably 200 µm or less, and even more preferably 100 µm or less. In other words, the film thickness of the phosphor sheet is preferably 1 µm to 1,000 µm, more preferably 10 µm to 200 µm, and even more preferably 10 µm to 100 µm. By producing the phosphor sheet with a film thickness of 1,000 µm or less, light absorption and light scattering by the binder resin and the phosphor can be reduced, and therefore a phosphor sheet having excellent optical characteristics is obtained.

Here, the "film thickness" can be determined, for example, by using a micrometer to measure the film thickness at a plurality of locations on the phosphor sheet (for example, when the phosphor sheet is a rectangular shape, a total of 5 locations composed of one location in the center of the phosphor sheet and one location at each of the 4 corners of the phosphor sheet), and then calculating the average value of the plurality of measurements.

The phosphor sheet may be formed on a support substrate, or no support substrate may be used. Conventional metals, films, glass, ceramics and papers and the like may be used as the support substrate without any particular limitations. Specific examples of the support substrate include transparent inorganic oxide glass such as quartz glass, borosilicate glass and sapphire; metal sheets or foils such as aluminum (including aluminum alloys), zinc, copper and iron; plastic films such as cellulose acetate, polyethylene terephthalate (PET), polyethylene, polyester, polyamide, polyimide, polyphenyl sulfide, polystyrene, polypropylene, polycarbonate, polyvinyl acetal and aramid; papers that have been laminated with any of the above plastics or papers that have been coated with any of the above plastics; papers on which any of the above metals have been laminated or deposited; and plastic films on which any of the above metals have been laminated or deposited. Among the above, inorganic oxide glass and metal sheets are preferable. There are no particular limitations on the thickness of the support substrate, but from the viewpoint of ensuring sufficient strength to preserve the substrate shape, and from an economic perspective, the thickness is preferably 30 µm or more, and more preferably 50 µm or more. Further, the thickness is preferably 5,000 µm or less, and more preferably 3,000 µm or less. In other words, the thickness of the support substrate is preferably 30 µm to 5,000 µm, and more preferably 50 µm to 3,000 µm.

<Method for Producing Phosphor Sheet>

A method for producing the phosphor sheet that represents one embodiment of the present invention is described below. However, the following description is merely one example, and the method for producing the phosphor sheet is not limited to this particular example. First, a composition comprising the phosphor dispersed in resins (namely, resins including at least the component (A) and the component (B)) (hereinafter also referred to as the "composition for producing a phosphor sheet") is prepared as a coating liquid for forming the phosphor sheet. Inorganic particles and other additives such as adhesion assistants may also be added to improve the diffusion and coating properties. A solvent may also be added to form a solution if the fluidity needs to be adjusted to an appropriate level. There are no particular limitations on the solvent provided it is capable of adjusting the viscosity of fluid-state resins. For example, the solvents mentioned above for the solvent P and the solvent may be used.

Following combining of these components in a prescribed formulation, the composition is nixed and dispersed uniformly using a stirring and mixing device such as a homogenizer, self-revolving mixer, triple roller, ball mill, planetary ball mill or beads mill, thus obtaining a composition for producing a phosphor sheet. Following the mixing and dispersion, or during the mixing and dispersion process, degassing may be performed under vacuum or reduced-pressure conditions.

Next, the thus obtained composition for producing a phosphor sheet is applied to the support substrate. Application may be performed using a reverse roll coater, blade coater, slit die coater, direct gravure coater, offset gravure coater, reverse roll coater, blade coater, kiss coater, natural roll coater, air knife coater, roll blade coater, variable roll blade coater, two stream coater, rod coater, wire coater, applicator, dip coater, curtain coater, spin coater, or knife coater or the like. In order to achieve good uniformity of the phosphor sheet film thickness, application is preferably performed using a slit die coater. Further, the phosphor sheet that represents one embodiment of the present invention may also be produced using a printing method such as screen printing, gravure printing or lithographic printing. When a printing method is used, screen printing is preferred from the viewpoint of simplicity.

Subsequently, heating is performed. Heating is performed using an apparatus such as a natural convection oven, blast oven, vacuum oven, inert oven, hot plate, hot press apparatus or infrared heater. Among these, from the viewpoint of achieving higher productivity, the use of a blast oven is preferred. For example, a method in which heating is performed at 40 to 250° C. for a period of 5 minutes to 6 hours may be used. For example, following addition of the phosphor and the curing catalyst (C) to the silicone-based encapsulating material composition, curing may be performed by leaving the composition to stand in an atmosphere at a temperature of 250° C. or lower, for example by leaving the composition to stand in an atmosphere at a temperature of 40 to 200° C. Further, during curing, in order to remove solvents and water that exist in the silicone-based encapsulating material composition, and better control the condensation reaction rate of the silicone resins, the composition may be cured in a stepwise manner, for example at 40 to 60° C. for 5 to 30 minutes, subsequently at 60 to 100° C. for 10 to 60 minutes, and then at 140 to 200° C. for 30 minutes to 5 hours.

[Semiconductor Light-Emitting Device]

One embodiment of the present invention provides a semiconductor light-emitting device comprising a substrate, a semiconductor light-emitting element disposed on the substrate, and an encapsulating portion provided covering the surface of the semiconductor light-emitting element, wherein the periphery of the semiconductor light-emitting element is enclosed and encapsulated by the substrate and the encapsulating portion, the encapsulating portion comprises a cured product of a composition comprising the bifunctional thermosetting silicone resin (A) and the multifunctional thermosetting silicone resin (B) having a hydroxyl group, and when the abundance ratio of the component (A) in the encapsulating portion relative to the total mass of the component (A) and the component (B) is compared at two arbitrary points in the thickness direction between the surface of the encapsulating portion that contacts the semiconductor light-emitting element and the surface of the encapsulating portion that contacts the external atmosphere, the abundance ratio of the component (A) at the point closer to the surface that contacts the semiconductor light-emitting element is at least as large as the abundance ratio of the component (A) at the point closer to the surface that contacts the external atmosphere.

The semiconductor light-emitting device of the present embodiment is preferably a device in which the semiconductor light-emitting element is encapsulated with a cured product of the silicone-based encapsulating material composition described above.

FIG. 1 is a cross-sectional view of a semiconductor light-emitting device 100 that represents one embodiment of the present invention. The semiconductor light-emitting device 100 comprises a substrate 110, a semiconductor light-emitting element 120 disposed on the substrate, and an encapsulating portion 130 that encapsulates the semiconductor light-emitting element 120. The encapsulating portion 130 is formed from a silicone-based encapsulating material obtained by curing a silicone-based encapsulating material composition. As illustrated in the figure, the semiconductor light-emitting element 120 is covered and encapsulated by the substrate 110 and the encapsulating portion 130, and is thus isolated from the external atmosphere.

The encapsulating portion 130 comprises a cured product of a composition comprising the bifunctional thermosetting silicone resin (A) and the multifunctional thermosetting silicone resin (B) having a hydroxyl group. The encapsulating portion 130 has no discontinuous surfaces in the direction perpendicular to the substrate 110. The existence or absence of discontinuous surfaces can be ascertained, for example, by performing an X-Ray CT measurement. In X-ray CT, because the scattering intensity differs depending on the electron density, a discontinuous surface within the material appears as a different shade in the CT image. Further, when the encapsulating portion 130 is compared at two arbitrary points in the thickness direction between the surface of the encapsulating portion that contacts the semiconductor light-emitting element 120 and the surface of the encapsulating portion that contacts the external atmosphere, the abundance ratio (mass ratio) of the component (A) relative to the total mass of the component (A) and the component (B) at the point closer to the surface that contacts the semiconductor light-emitting element 120 is at least as large as the abundance ratio of the component (A) at the point closer to the surface that contacts the external atmosphere.

In a separate aspect, the abundance ratio (mass ratio) of the component (A) relative to the total mass of the component (A) and the component (B) in a semiconductor light-emitting element vicinity 130*a* of the encapsulating portion 130 is equal to or higher than the abundance ratio (mass ratio) of the component (A) relative to the total mass of the component (A) and the component (B) in a surface vicinity 130*b* of the encapsulating portion that contacts the external atmosphere.

In this description, "vicinity" means a region with a thickness of about several μm from the specified surface. The thickness of the encapsulating portion 130 is preferably 0.1 to 2.5 mm.

Here, the "thickness of the encapsulating portion" means the shortest distance from the surface of the semiconductor element to the surface of the encapsulating portion that contacts the external atmosphere. The thickness can be measured from a microscope image viewed from a side surface. Further, the thickness can also be determined by measuring the thicknesses of the substrate, the element, and the combination of substrate+element+encapsulating portion following encapsulating, and then calculating the thickness of the encapsulating portion.

This abundance ratio characteristic is based on the fact that, as described above, the bifunctional thermosetting silicone resin (A) and the multifunctional thermosetting silicone resin (B) having a hydroxyl group contained in the silicone-based encapsulating material composition prior to curing are miscible in a range from normal temperature to the curing temperature (for example, from 25 to 200° C.).

The expression that "the abundance ratio (mass ratio) of the component (A) relative to the total mass of the component (A) and the component (B) at the point closer to the semiconductor light-emitting element 120 is equal to or higher than the abundance ratio (mass ratio) of the component (A) relative to the total mass of the component (A) and the component (B) at the point in the encapsulating portion 130 closer to the surface that contacts the external atmosphere" means that the abundance ratio values for the component (A) in the upper surface portion of the encapsulating portion 130 (namely, the portion of the encapsulating portion 130 in be vicinity of the surface that contacts the external atmosphere, the point closer to the outer surface of the encapsulating portion 130) and the lower surface portion of the encapsulating portion 130 (namely, the portion of the encapsulating portion 130 in the vicinity of the semiconductor light-emitting element, the point in the encapsulating portion 130 closer to the surface that contacts the semiconductor light-emitting element 120) are either equal, or the abundance ratio is higher in the lower surface portion than in the upper surface portion.

The fact that the abundance ratio of the component (A) is equal in the upper surface portion of the encapsulating portion 130 and the lower surface portion of the encapsulating portion 130 is based on the fact that the component (A) and the component (B) are miscible. The expression that "the abundance ratio values for the component (A) are equal" means that the ratio (mass ratio) between the component (A) and the component (B) is substantially uniform in the upper surface portion of the encapsulating portion 130 and the lower surface portion of the encapsulating portion 130. It is thought that this yields a further improvement in the crack resistance of the silicone-based encapsulating material or the encapsulating portion formed from the silicone-based encapsulating material.

The fact that the abundance ratio of the component (A) is higher in the lower surface portion of the encapsulating portion than in the upper surface portion of the encapsulating portion is based on the fact that, as described above, the component (A) is more readily volatilized than the component (B). Even in this case, the difference in the abundance ratio values for the component (A) and the component (B) is 10% by mass or less, and it could be said that the abundance ratio values are substantially uniform in the upper surface portion of the encapsulating portion and the lower surface portion of the encapsulating portion. Even in this case, the encapsulating portion exhibits excellent crack resistance.

In this description, the "semiconductor light-emitting device" comprises elements that emit electromagnetic waves not only in the visible region, but also in the infrared region or the ultraviolet region.

Next is a description of a light-emitting device in which the light-emitting surface of the semiconductor light-emitting element is covered with the phosphor sheet described above. The phosphor sheet may be provided directly on top of the light-emitting surface of the semiconductor light-emitting element, or may be provided on the light-emitting surface with a transparent resin or the like disposed therebetween, or a space may be provided between the semiconductor light-emitting element and the phosphor sheet.

Examples of the method used for covering the element with the phosphor sheet include a method in which the phosphor sheet is bonded via an adhesive resin, and a method in which heating is used to cause the phosphor sheet itself to soften and develop adhesiveness, and this adhesiveness is used to bond the phosphor sheet. The semiconductor light-emitting element used in this type of light-emitting device is preferably an LED or a laser, and in terms of semiconductor light-emitting elements that enable the effects of the present invention to manifest particularly effectively, blue LEDs, blue lasers, ultraviolet LEDs and ultraviolet lasers, which require high levels of heat resistance and light resistance, are preferable, and ultraviolet LEDs and ultraviolet lasers are particularly preferred.

The silicone-based encapsulating material, encapsulating portion and phosphor sheet according to the present invention exhibit high UV light transmittance, little UV light degradation, and excellent crack resistance. Further, compared with UV-LEDs encapsulated with quartz glass, the UV light extraction efficiency is higher, and the cost is lower.

The semiconductor light-emitting device that represents one embodiment of the present invention may be a UV light-emitting device. This type of UV light-emitting device has superior UV light transmittance, suffers little UV light degradation of the encapsulating portion or the phosphor sheet, and exhibits excellent crack resistance for the encapsulating portion or the phosphor sheet. Moreover, the UV light extraction efficiency is high, and the cost is low.

EXAMPLES

Test examples are presented below to describe specifics of the present invention, but the present invention is in no way limited by the test examples described below.

The measurement conditions used in the various measurements described in the following test examples were as follows.

<Measurement of Infrared Absorption Spectra>
Apparatus name: model 670 manufactured by Varian Inc.
Attachment: Golden Gate Diamond ATR
Measured wavelengths: 4,000 to 700 $cm^{-1}$
Resolution: 4 $cm^{-1}$
Background measurement: open atmosphere
Number of integrations: 32

<GPC Measurement Conditions>
Apparatus name: HLC-8120 GPC manufactured by Tosoh Corporation
Columns: TSKgel Multipore HXL-M×3 columns
Flow rate: 1.0 ml/minute
Detection conditions: RI
Concentration: 100 mg+5 ml (THF)

Injection volume: 100 μl
Column temperature: 40° C.
Eluent: THF
<Transmittance Measurement Conditions>
Apparatus name: UV-3600 manufactured by Shimadzu Corporation
Measurement cell: glass cell, thickness: 10 mm
Wavelengths measured: 190 nm to 800 nm
Background: DMS-S21 (refractive index: 1.402) manufactured by Gelest, Inc.
<Heat Shock Test>
Apparatus name: Small Thermal Shock Apparatus TSE-11A manufactured by Espec Corporation
Cooling/heating temperature: −30° C.⇌85° C.
Hold time: 30 minutes
Number of cycles: 50 cycles Test Example 1

(Measurement of Infrared Absorption Spectrum of Component (A))

The infrared absorption spectrum was measured for a resin A1 (weight-average molecular weight=2,100, high molecular weight side 5% fraction molecular weight=4,609), which is a bifunctional thermosetting silicone resin (A) represented by formula (3) shown below that is liquid at 25° C.

[Chemical formula 2]

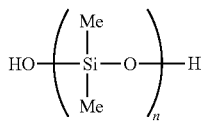

(3)

[In the Formula, Me Represents a Methyl Group, and n is an Integer of 1 or Greater.]

Figure 2A:
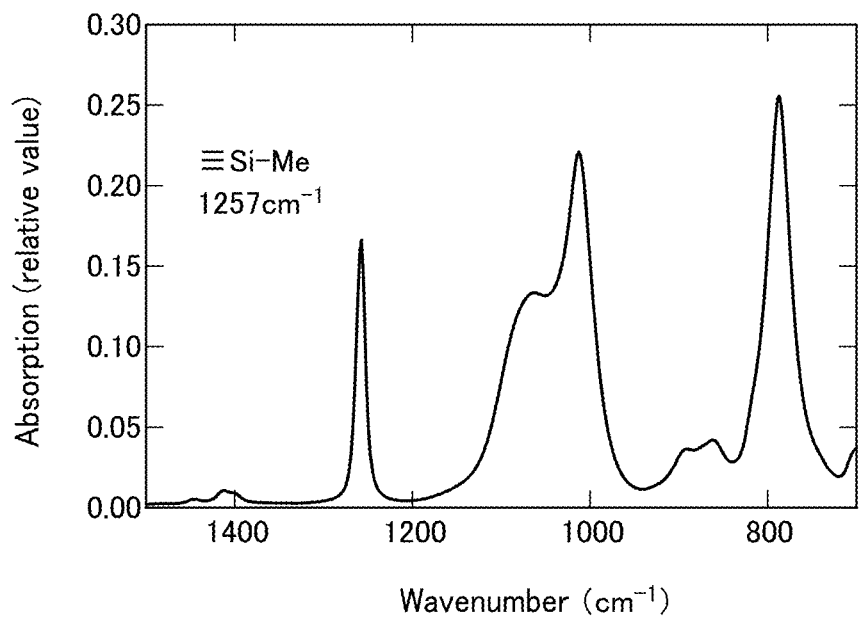
FIG. 2A is a graph illustrating the results of measuring the infrared absorption spectrum of a bifunctional thermosetting silicone resin.

FIG. 2A is a graph illustrating the results of measuring the infrared absorption spectrum of the resin A1. A peak position attributable to the linkage was measured at 1,257 cm$^{-1}$.

(Measurement of Infrared Absorption Spectrum of Component (B))

The infrared absorption spectrum was measured for a resin B1 (weight-average molecular weight=3,500), which is a multifunctional thermosetting silicone resin (B) having a hydroxyl group that is solid at 25° C. and has an organopolysiloxane structure in which the repeating units shown in Table 1 have the respective abundance ratios shown in Table 1.

TABLE 1

| | Resin B1 | | |
|---|---|---|---|
| Repeating units | ![OCH3-Si(CH3)-O] | ![OH-Si(CH3)-O] | ![Si-O-Si(CH3)-O] |
| Abundance ratio | 0.08 | 0.15 | 0.77 |

Figure 2B:
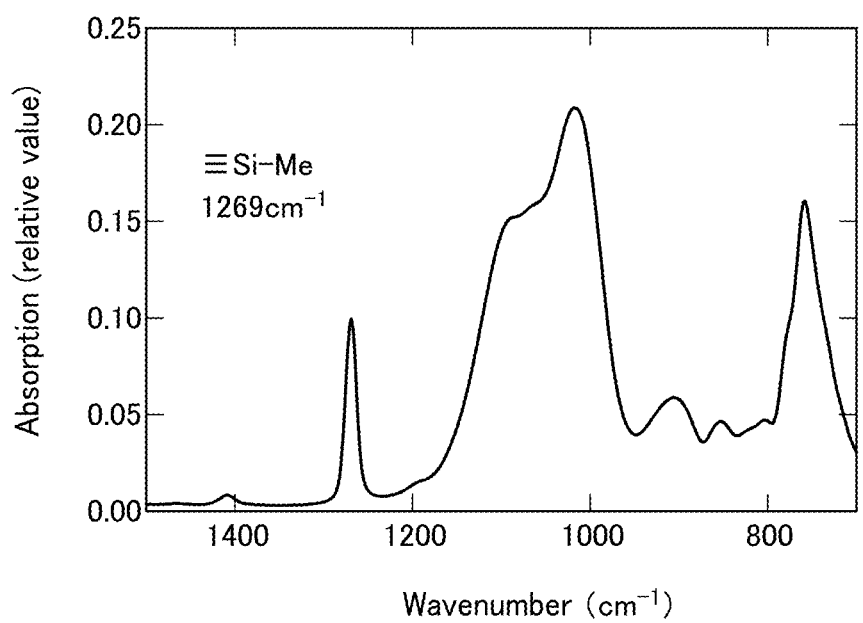
FIG. 2B is a graph illustrating the results of measuring the infrared absorption spectrum of a multifunctional thermosetting silicone resin having a hydroxyl group.

FIG. 2B is a graph illustrating the results of measuring the infrared absorption spectrum of the resin B1. A peak position attributable to the ≡Si-Me linkage was measured at 1,269 cm$^{-1}$.

Test Example 2

(Measurement of Abundance Ratios of Component (A) and Component (B) in Vicinity of Upper Surface and Vicinity of Lower Surface of Silicone-Based Encapsulating Material)

A silicone-based encapsulating material composition prepared using the above resin A1 and the above resin B1 in a mass ratio of 40:60 was heat cured to produce a silicone-based encapsulating material. Specifically, a flask fitted with a reflux condenser and installed in a water bath was charged with 60.0 g of the above resin B1 and 32.2 g of isopropyl alcohol, and the resin was completely dissolved by stirring the liquid while the isopropyl alcohol was refluxed at a liquid temperature of 80 to 85° C.

Next, 40.0 g of the above resin A1 was added to the solution of the resin B1, and the resulting mixture was stirred for at least 1 hour to effect dissolution.

Subsequently, 6.4 g of 2-butoxyethyl acetate as a solvent and 0.026 g of 3-glycidoxypropyltrimethoxysilane as a silane coupling agent were added to the obtained composition, and the resulting mixture was set in an evaporator and left under conditions including a composition temperature of 80° C. and a pressure of 4 kPa, thereby removing the isopropyl alcohol by distillation until the concentration of isopropyl alcohol in the composition was reduced to not more than 1% by mass.

Next, 3% by mass of a silicone oligomer represented by formula (4) shown below (wherein n is an integer of 3 to 7) containing 15% by mass of phosphoric acid as a curing catalyst was added to the above composition and stirred and mixed thoroughly to obtain a silicone-based encapsulating material composition.

[Chemical formula 3]

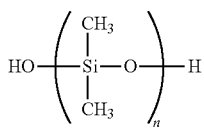

(4)

Subsequently, 3.8 g of the above silicone-based encapsulating material composition was placed in an aluminum cup, the cup was placed in an oven, the temperature raised to 40° C. over a period of 10 minutes and then held for 10 minutes, and the temperature was their raised to 150° C. over a period of 2 hours and then held for a further 5 hours, thereby heat curing the silicone-based encapsulating material composition and obtaining a silicone-based encapsulating material.

An infrared absorption spectrum was measured in the vicinity of the upper surface and in the vicinity of the lower surface of the obtained silicone-based encapsulating material. Here the "vicinity of the upper surface of the silicone-based encapsulating material" means the region having a thickness of about several μm from the outer surface of the silicone-based encapsulating material formed inside the aluminum cup. Further, the "vicinity of the lower surface of the silicone-based encapsulating material" means the region having a thickness of about several μm from the bottom surface of the silicone-based encapsulating material formed inside the aluminum cup. The infrared absorption spectra were measured by the ATR method (attenuated total reflection method). By using this measurement method, information can be obtained for a thickness of about several μm from the surface.

Figure 3A:
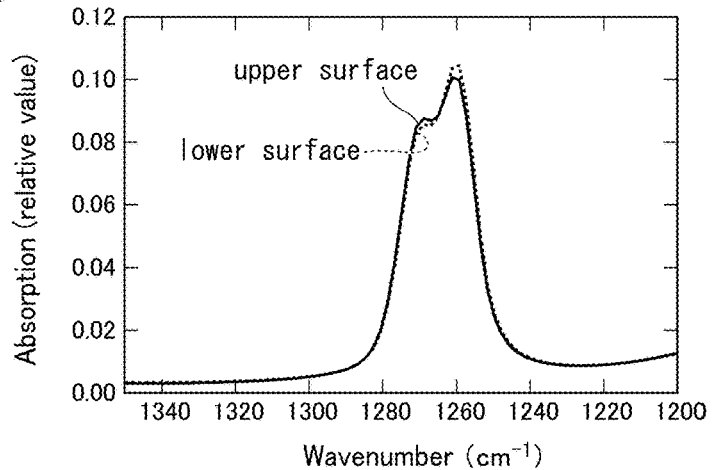
FIG. 3A is a graph illustrating the results of measuring the infrared absorption spectrum of a silicone encapsulating material in the vicinity of the upper surface and in the vicinity of the lower surface.

FIG. 3A illustrates the results of superimposing the graphs of the infrared absorption spectra in the vicinity of the upper surface and in the vicinity of the lower surface. The peak at 1,257 cm$^{-1}$ is a peak attributable to the ≡Si-Me linkage of the component (A), and the peak at 1,269 cm$^{-1}$ is a peak attributable to the ≡Si-Me linkage of the component (B).

The results indicated that the abundance ratio of the component (A) in the vicinity of the lower surface of the silicone-based encapsulating material was slightly higher than the abundance ratio of the component (A) in the vicinity of the upper surface.

Test Example 3

(Measurement of Abundance Ratios of Component (A) and Component (B) in Vicinity of Upper Surface and in Vicinity of Lower Surface of Silicone-Based Encapsulating Material)

With the exception of altering the ratio between the resin A1 and the resin B1 to a mass ratio of 30:70, a silicone-based encapsulating material composition was produced in a similar manner to Test Example 2, and the composition was then heat cured in a similar manner to Test Example 2 to obtain a silicone-based encapsulating material. In other words, 30.0 g of the resin A1 and 70.0 g of the resin B1 were used. Further, 9.9 g of 2-butoxyethyl acetate was used as a solvent.

Infrared absorption spectra of be thus obtained silicone-based encapsulating material were measured in the vicinity of the upper surface and in the vicinity of the lower surface in a similar manner to Test Example 2.

Figure 3B:
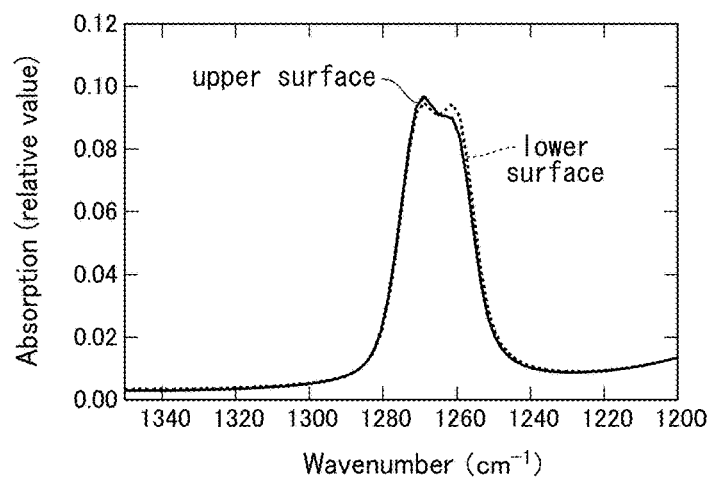
FIG. 3B is a graph illustrating the results of measuring the infrared absorption spectrum of a silicone encapsulating material in the vicinity of the upper surface and in the vicinity of the lower surface.

FIG. 3B illustrates the results of superimposing the graphs of the infrared absorption spectra in the vicinity of the upper surface and in the vicinity of the lower surface. The peak at 1,257 cm$^{-1}$ is a peak attributable to the ≡Si-Me linkage of the component (A), and the peak at 1,269 cm$^{-1}$ is a peak attributable to the ≡Si-Me linkage of the component (B).

The results indicated that the abundance ratio of the component (A) in the vicinity of the lower surface of the silicone-based encapsulating material was slightly higher than the abundance ratio of the component (A) in the vicinity of the upper surface.

Test Example 4

(Measurement of Abundance Ratios of Component (A) and Component (B) in Vicinity of Upper Surface and in Vicinity of Lower Surface of Silicone-Based Encapsulating Material)

With the exceptions of altering the ratio between the resin A1 and the resin to a mass ratio of 80:20, and adding 4% by mass of the curing catalyst, a silicone-based encapsulating material composition was produced in a similar manner to Test Example 2, and the composition was then heat cured in a similar manner to Test Example 2 to obtain a silicone-based encapsulating material. In other words, 80.0 g of the resin A1 and 20.0 g of the resin B1 were used. Further, no solvent was used. Furthermore, a silicone oligomer represented by formula (4) shown above (wherein n is an integer of 3 to 7) containing 15% by mass of phosphoric acid was used as the curing catalyst.

Infrared absorption spectra of the thus obtained silicone-based encapsulating material were measured in the vicinity of the upper surface and in the vicinity of the lower surface in a similar manner to Test Example 2.

Figure 3C:
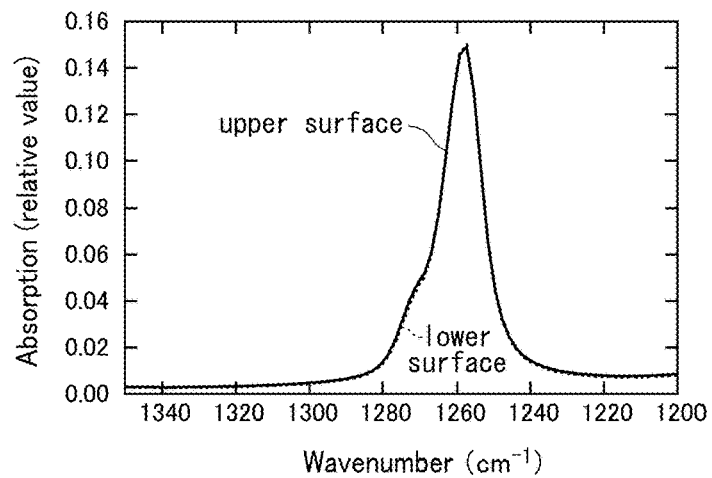
FIG. 3C is a graph illustrating the results of measuring the infrared absorption spectrum of a silicone encapsulating material in the vicinity of the upper surface and in the vicinity of the lower surface.

FIG. 3C illustrates the results of superimposing the graphs of the infrared absorption spectra in the vicinity of the upper surface and in the vicinity of the lower surface. The peak at 1,257 cm$^{-1}$ is a peak attributable to the ≡Si-Me linkage of the component (A), and the peak at 1,269 cm$^{-1}$ is a peak attributable to the ≡Si-Me linkage of the component (B).

The results indicated that the abundance ratio of the component (A) in the vicinity of the lower surface of the silicone-based encapsulating material was slightly higher than the abundance ratio of the component (A) in the vicinity of the upper surface.

Test Example 5

(Heat Shock Test)

The silicone-based encapsulating material composition produced in Test Example 3 was cured on a substrate for a semiconductor light-emitting element. A metal-plated electrode substrate (formed from LTCC) having a size of 3.5 mm×3.5 mm was used. The silicone-based encapsulating material composition was heat cured under the same conditions as those described in Test Example 2.

Subsequently, the thus obtained semiconductor light-emitting device was subjected to a heat shock test in which a temperature cycle including 30 minutes at each of −30° C. and 85° C. was repeated 50 times, and the occurrence of cracking was then evaluated (n=3).

Figure 4A:
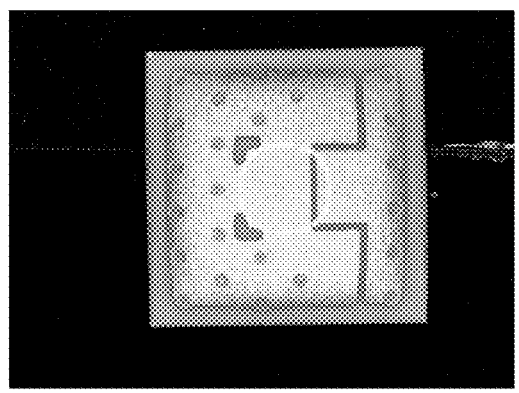
FIG. 4A is a photograph illustrating the results of a heat shock test on a semiconductor light-emitting device.

FIG. 4A is one example of a photograph showing be result of the heat shock test for the semiconductor light-emitting device.

The results of performing the heat shock test on each of the three semiconductor light-emitting devices revealed absolutely no cracking. This indicated that the silicone-based encapsulating material of this test example had superior crack resistance.

Test Example 6

(Heat Shock Test)

The silicone-based encapsulating material composition produced in Test Example 4 was cured on a substrate for a semiconductor light-emitting element in a similar manner to Test Example 5.

Subsequently, the thus obtained semiconductor light-emitting device was subjected to a heat shock test in which a temperature cycle including 30 minutes at each of −30° C. and 85° C. was repeated 50 times, and the occurrence of cracking was then evaluated (n=3).

Figure 4B:
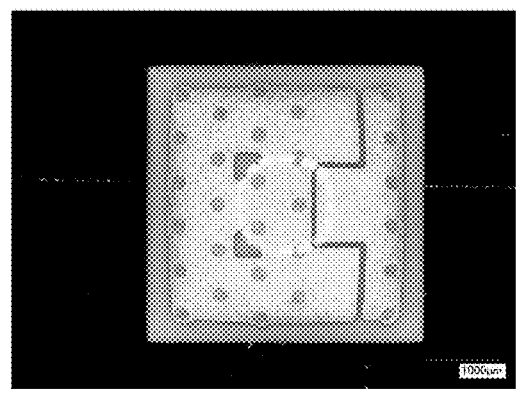
FIG. 4B is a photograph illustrating the results of a heat shock test on a semiconductor light-emitting device.

FIG. 4B is one example of a photograph showing the result of the heat shock test for the semiconductor light-emitting device.

The results of performing the heat shock test on each of the three semiconductor light-emitting devices revealed absolutely no cracking. This indicated that the silicone-based encapsulating material of this test example had superior crack resistance.

Test Example 7

(Heat Shock Test)

A silicone-based encapsulating material composition was produced containing the above resin B1 as the multifunctional thermosetting silicone resin (B) having a hydroxyl group, but containing no bifunctional thermosetting silicone resin (A).

Subsequently, this silicone-based encapsulating material composition was cured on a substrate for a semiconductor light-emitting element in a similar manner to Test Example 5.

Specifically, a flask fitted with a reflux condenser and installed in a water bath was charged with 354 g of the above resin B1 and 190 g of isopropyl alcohol, and the resin was completely dissolved by stirring the liquid while the isopropyl alcohol was refluxed at a liquid temperature of 80 to 85° C.

Next, 35 g of a resin D1 (weight-average molecular weight=450) having an organopolysiloxane structure in which the repeating units shown in Table 2 have the respective abundance ratios shown in Table 2 was added to the solution of the above resin 1, and the resulting mixture was stirred for at least 1 hour to effect dissolution.

TABLE 2

| | Resin D1 | | |
|---|---|---|---|
| Repeating units | $\left(H_3CO-\underset{\underset{CH_3}{\|}}{\overset{\overset{OCH_3}{\|}}{Si}}-O\right)$ | $\left(-\underset{\underset{CH_3}{\|}}{\overset{\overset{OCH_3}{\|}}{Si}}-O-\right)$ | $\left(-\underset{\underset{\underset{CH_3}{\|}}{Si-O}}{\overset{\overset{\overset{Si}{\|}}{O}}{\|}}-\right)$ |
| Abundance ratio | 0.39 | 0.49 | 0.12 |

Subsequently, 123 g of 2-butoxyethyl acetate as a solvent and 0.1 g of 3-glycidoxypropyltrimethoxysilane as a silane coupling agent were added to the obtained composition, and the resulting mixture was set in an evaporator and left under conditions including a composition temperature of 70° C. and a pressure of 4 kPa, thereby removing the isopropyl alcohol by distillation until the concentration of isopropyl alcohol in the composition was reduced to 1% by mass or less.

Next, 2% by mass of a silicone oligomer represented by the above formula (4) (wherein n is an integer of 3 to 7) containing 15% by mass of phosphoric acid as the curing catalyst (C) was added to the above composition and stirred and mixed thoroughly to obtain a silicone-based encapsulating material composition.

Subsequently, this silicone-based encapsulating material composition was cured on a substrate for a semiconductor light-emitting device. The silicone-based encapsulating material composition was heat cured under similar conditions to those used in Test Example 2, namely by raising the temperature in an oven to 40° C. over a period of 10 minutes, holding for 10 minutes, and then raising the temperature to 150° C. over a period of 2 hours and holding that temperature for a further 5 hours.

Subsequently, the thus obtained semiconductor light-emitting device was subjected to a heat shock test in which a temperature cycle including 30 minutes at each of −30° C. and 85° C. was repeated 50 times, and the occurrence of cracking was then evaluated (n=4).

Figure 4C:
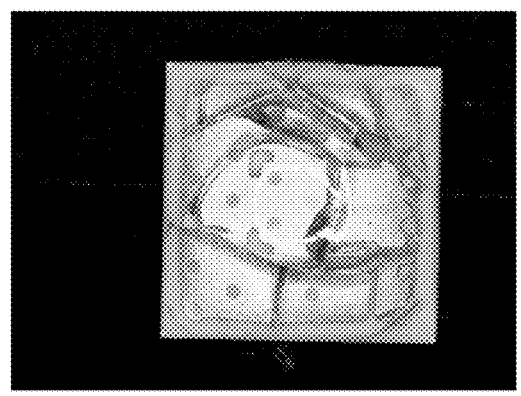
FIG. 4C is a photograph illustrating the results of a heat shock test on a semiconductor light-emitting device.

FIG. 4C is one example of a photograph showing the result of the heat shock test for the semiconductor light-emitting device.

The results of performing the heat shock test on each of the four semiconductor light-emitting devices revealed visible cracking in all of the semiconductor light-emitting devices.

Test Example 8

(Investigation of Silicone-Based Encapsulating Material Composition)

Silicone-based encapsulating material compositions containing various resin components were each cured on a substrate for a light-emitting device in a similar manner to that described in Test Example 5.

Specifically, 0.275 g (1.35 mmol) of aluminum isopropoxide (product number: 016-16015, manufactured by Wako Pure Chemical Industries, Ltd.) as the component (C) was added to 200 g (66.7 mmol) of a silanol-terminated silicone oil (a compound represented by the above formula (3), product number: KF-9701, manufactured by Shin-Etsu Chemical Co., Ltd., number average molecular weight: 3,000) as the component (A), and the resulting mixture was stirred and reacted at room temperature (25° C.) for 24 hours in the absence of any solvent. Subsequently, impurities were removed by centrifugal separation, and subsequent concentration under reduced pressure at 50° C. for 2 hours yielded a mixture of aluminosiloxane and silanol-terminated silicone oil as a colorless and transparent oil (weight ratio: aluminosiloxane/silanol-terminated silicone oil=6/94).

To 90 parts by mass of the above mixture was added and mixed 10 parts by mass of a silicone alkoxy oligomer (methoxy group content: 24% by weight, product number: X-40-9225, manufactured by Shin-Etsu Chemical Co., Ltd.), which is a multifunctional thermosetting silicone resin having no hydroxyl group, thus obtaining a silicone-based encapsulating material composition.

Subsequently, this silicone-based encapsulating material composition was cured on a substrate for a semiconductor light-emitting device. The silicone-based encapsulating material composition was heat cured under conditions that included raising the temperature in an oven to 40° C. over a period of 10 minutes, holding for 10 minutes, and then raising the temperature to 150° C. over a period of 2 hours and holding that temperature for a further 24 hours.

As a result, the silicone-based encapsulating material detached completely from the substrate. This result indicates that the silicone-based encapsulating material of this test example does not function as an encapsulating material.

Test Example 9

(Investigation of Miscibility)

For the component (A), the resin A1 described above, a resin A2 (weight-average molecular weight=4,200, high molecular weight side 5% fraction molecular weight=10, 100), represented by the same formula (3) as the resin A1, and a resin A3 (Weight-average molecular weight=950, high molecular weight side 5% fraction molecular weight=1, 800), represented by the same formula (3) as the resin A1 were used.

For the component (B), the resin B1 described above, a resin B2 having an organopolysiloxane structure in which the repeating units shown below in Table 3 have the respective abundance ratios shown in Table 3 (weight-average molecular weight=58,300), a resin B3 having an organopolysiloxane structure in which the repeating units shown below in Table 4 have the respective abundance ratios shown in Table 4 (weight-average molecular weight=3,000), and a resin B4 having an organopolysiloxane structure in which the repeating units shown below in Table 5 have the respective abundance ratios shown in Table 5 (weight-average molecular weight=2,300) were used.

TABLE 3

Resin B2

| Repeating units | [Me—Si(Me)(Me)—O] | [Si(O)(Si—O)(Me)] |
|---|---|---|
| Abundance ratio | 0.14 | 0.86 |

[In the formulas, Me represents a methyl group]

TABLE 4

Resin B3

| Repeating units | [RO—Si(OR)(Me)—O] | [Si(OR)(Me)—O] | [Si(O)(Si—O)(Me)] |
|---|---|---|---|
| Abundance ratio | 0.01 | 0.26 | 0.73 |

[In the formulas, Me represents a methyl group, and R represents a hydrogen atom or an ethyl group]

TABLE 5

Resin B4

| Repeating units | [RO—Si(OR)(Me)—O] | [Si(OR)(Me)—O] | [Si(O)(Si—O)(Me)] |
|---|---|---|---|
| Abundance ratio | 0.02 | 0.47 | 0.51 |

[In the formulas, Me represents a methyl group, and R represents a hydrogen atom or an ethyl group]

The weight-average molecular weight of each resin is shown in Table 6. Further, the number of hydroxyl groups per 100 silicon atoms in each of the resins is shown in Table 7.

TABLE 6

| Resin | Weight-average molecular weight |
|---|---|
| Resin A1 | 2,100 |
| Resin A2 | 4,200 |
| Resin A3 | 950 |

TABLE 7

| Resin | Number of hydroxyl groups per 100 silicon atoms |
|---|---|
| Resin B1 | 15 |
| Resin B2 | 0 |

TABLE 7-continued

| Resin | Number of hydroxyl groups per 100 silicon atoms |
|---|---|
| Resin B3 | 26 |
| Resin B3 | 46 |

The component (A) and the component (B) were mixed in a mass ratio of 40:60 in the combinations shown in Table 8, and an evaluation was made as to whether the components were miscible. Specifically, a mixed solution of the resin A and the resin B was prepared using a similar method to that described in Test Example 2, and the visible light transmittance at a wavelength of 600 nm was measured at room temperature using a cell with an optical path length of 1 cm.

The determination as to whether or not the resins were miscible was evaluated against the following criteria.

A: the transmittance was 70% or higher (resins were miscible)

B: the transmittance was less than 70% (resins were immiscible)

Figure 5:
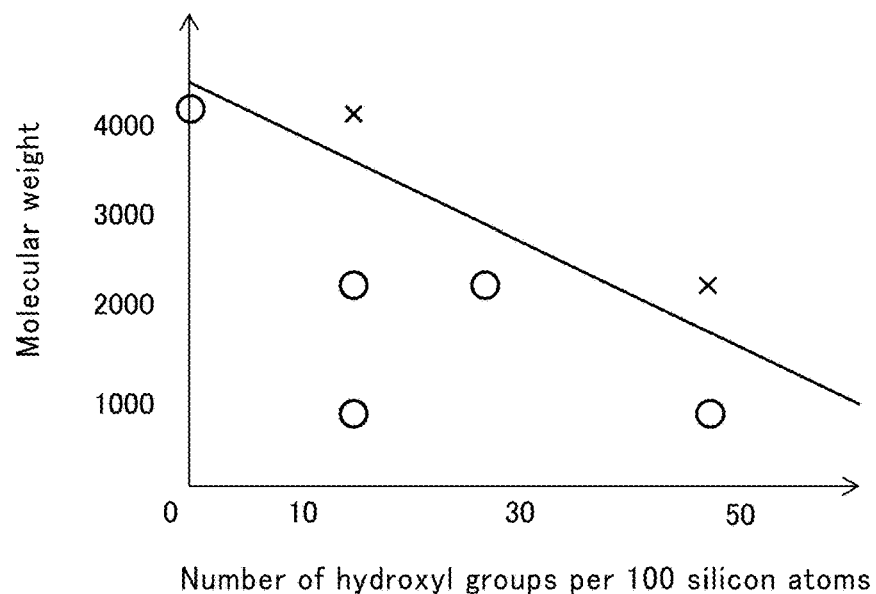
FIG. 5 is a graph illustrating the relationship between the weight-average molecular weight of the bifunctional thermosetting silicone resin, and the number of hydroxyl groups of the multifunctional thermosetting silicone resin having a hydroxyl group.
Figure 6:
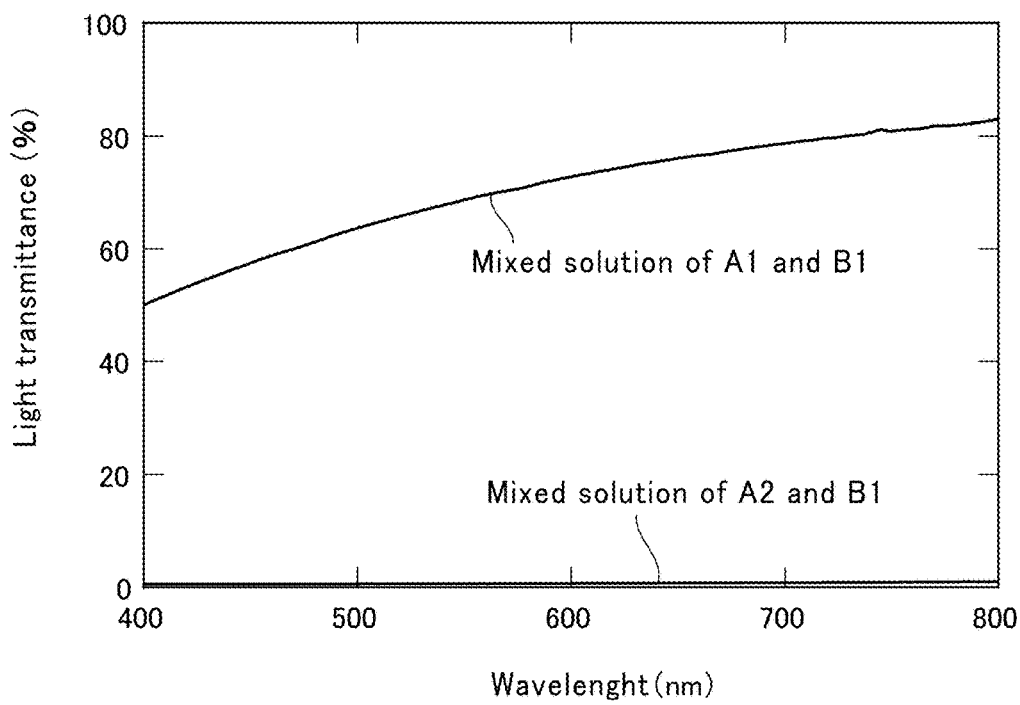
FIG. 6 is a graph illustrating the results of measuring the light transmittance of a resin mixed solution.
Figure 7:
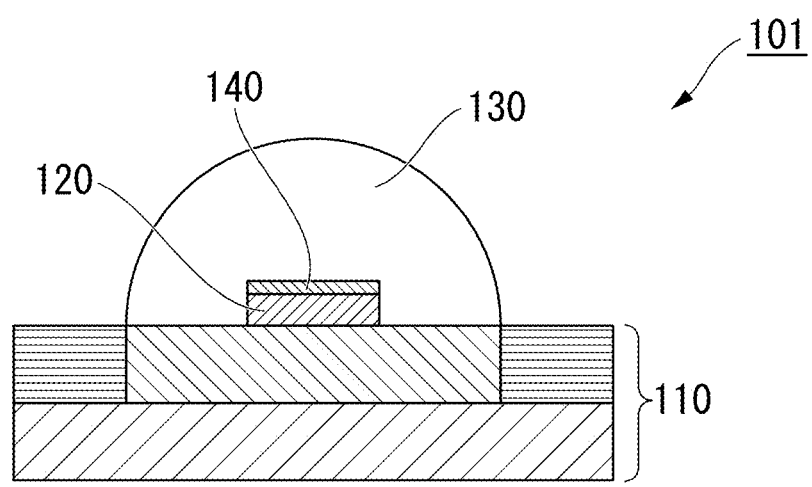
FIG. 7 is a cross-sectional view of a semiconductor light-emitting device having a phosphor sheet according to one embodiment of the present invention.

The results are shown in Table 8, and FIG. 5 and FIG. 6. FIG. 6 is a graph illustrating the results of measuring the light transmittance for the mixed solution of the resin A1 and the resin B2, and the mixed solution of the resin A2 and the resin B1. The graph of FIG. 5 revealed that the component (A) and the component (B) tended to be miscible in the range satisfied by formula (F1) shown below.

$$y < -60x + 4500 \tag{F1}$$

TABLE 8

|  | Resin B1 | Resin B2 | Resin B3 | Resin B4 |
|---|---|---|---|---|
| Resin A1 | A | — | A | B |
| Resin A2 | B | A | — | — |
| Resin A3 | A | — | — | A |

Further, a silicone-based encapsulating material composition was prepared from a combination of the resin B2 and the resin A2, and an attempt was made to perform heat curing under similar heating conditions to those used in Test Example 2, but the composition did not cure, and remained in liquid form following the heat treatment. This indicated that the condensation reaction proceeds satisfactorily in the range satisfied by formula (F2) shown below.

$$x > 0 \tag{F2}$$

Test Example 10

(Investigation of Miscibility)

For the component (A), the resin A1 described above (weight-average molecular weight=2,100, high molecular weight side 5% fraction molecular weight=4,609), and a resin A4 (weight-average molecular weight=2,100, high molecular weight side 5% fraction molecular weight=6,800), represented by the same formula (3) as the resin A1 were used. The resin B1 described above was used as the component (B).

The component (A) and the component (B) were mixed in a mass ratio of 40:60 in the combinations shown in Table 9, and an evaluation was made as to whether or not the components were miscible was made in a similar manner to Test Example 9. The results are shown in Table 9. The results revealed that the resin A1 and the resin B1 were miscible, but the resin A4 and the resin B1 were immiscible.

TABLE 9

| | Weight-average molecular weight (X) | High molecular weight side 5% fraction molecular weight (Y) | Y/X | Resin B1 |
|---|---|---|---|---|
| Resin A1 | 2,100 | 4,609 | 2.19 | A |
| Resin A4 | 2,100 | 6,800 | 3.24 | B |

INDUSTRIAL APPLICABILITY

The present invention is able to provide a silicone-based encapsulating material composition that forms a silicone-based encapsulating material upon curing that exhibits improved crack resistance, and can also provide a semiconductor light-emitting device having improved crack resistance, and is therefore extremely useful industrially.

DESCRIPTION OF THE REFERENCE SIGNS

100: Semiconductor light-emitting device
110: Substrate
120: Semiconductor light-emitting element
130: Encapsulating portion
130a: Semiconductor light-emitting element vicinity
130b: Encapsulating portion surface vicinity
140: Phosphor sheet

The invention claimed is:

1. A silicone-based encapsulating material composition comprising: a bifunctional thermosetting silicone resin (A), a multifunctional thermosetting silicone resin having a hydroxyl group (B), and a curing catalyst (C), wherein
a weight-average molecular weight of the component (A) is 300 to 4,500,
a weight-average molecular weight of the component (B) is 2,000 to 20,000,
a mass ratio of the component (B) relative to a total of a mass of the component (A) and a mass of the component (B) is 0.5% by mass or more and less than 100% by mass,
an average functional number of the component (A) is 1.7 to 2.3,
an average functional number of the component (B) is 2.5 to 3.5, and the repeating units constituting the component (B) which are trifunctional account for 50% by mass or more relative to a total mass of the component (B), and
a visible light transmittance measured at an optical path length of 1 cm and a wavelength of 600 nm is 70% or higher.

2. The silicone-based encapsulating material composition according to claim 1, wherein y as the weight-average molecular weight of the component (A) and x as the number of hydroxyl groups per 100 silicon atoms in the component (B) satisfy the following formulae (F1) and (F2).

$$y < -60x + 4500 \quad (F1)$$

$$x > 0 \quad (F2)$$

3. The silicone-based encapsulating material composition according to claim 1, wherein the composition is a two-liquid-type composition composed of a liquid composition comprising the component (A) and the component (B), and a liquid composition comprising the component (C).

4. The silicone-based encapsulating material composition according to claim 1, wherein a ratio of the component (B) relative to a total mass of the component (A) and the component (B) is 20 to 70% by mass.

5. The silicone-based encapsulating material composition according to claim 1, wherein a ratio of the component (C) relative to a total mass of the component (A) and the component (B) is 0.001 to 3.0% by mass.

6. The silicone-based encapsulating material composition according to claim 1, wherein the component (C) is a phosphoric acid-based catalyst.

7. The silicone-based encapsulating material composition according to claim 1, wherein the component (C) is an organic complex or an organic acid salt containing at least one metal selected from the group consisting of tin (Sn), zinc (Zn), iron (Fe), titanium (Ti), zirconium (Zr), bismuth (Bi), hafnium (Hf), yttrium (Y), aluminum (Al), boron (B) and gallium (Ga) as a metal component.

8. The silicone-based encapsulating material composition according to claim 1, further comprising: a multifunctional thermosetting silicone oligomer having no hydroxyl group and having a weight-average molecular weight of 300 to 1,500 (D) in an amount of 0.5 to 20% by mass relative to a total mass of the component (A) and the component (B).

9. A composition for a phosphor sheet, the composition comprising the silicone-based encapsulating material composition according to claim 1 and a phosphor.

10. A phosphor sheet produced by using the composition for a phosphor sheet according to claim 9.

11. A semiconductor light-emitting device comprising the phosphor sheet according to claim 10.

12. A semiconductor light-emitting device comprising:
a substrate,
a semiconductor light-emitting element disposed on the substrate, and
an encapsulating portion provided covering a surface of the semiconductor light-emitting element, wherein
a periphery of the semiconductor light-emitting element is enclosed and encapsulated by the substrate and the encapsulating portion,
the encapsulating portion comprises a cured product of a composition comprising:
a bifunctional thermosetting silicone resin (A), and a multifunctional thermosetting silicone resin having a hydroxyl group (B),
a weight-average molecular weight of the component (A) is 300 to 4,500,
a weight-average molecular weight of the component (B) is 2,000 to 20,000,
an average functional number of the component (A) is 1.7 to 2.3,
an average functional number of the component (B) is 2.5 to 3.5, and
when an abundance ratio of the component (A) in the encapsulating portion relative to a total mass of the component (A) and the component (B) is compared at two arbitrary points in a thickness direction between a surface of the encapsulating portion that contacts the semiconductor light-emitting element and a surface of the encapsulating portion that contacts the external atmosphere, the abundance ratio of the component (A) at the point closer to the surface that contacts the semiconductor light-emitting element is at least as large as the abundance ratio of the component (A) at the point closer to the surface that contacts the external atmosphere.

* * * * *